(12) United States Patent
Zurek et al.

(10) Patent No.: US 12,019,107 B2
(45) Date of Patent: Jun. 25, 2024

(54) MEASURING LOOP RESISTANCE

(71) Applicant: Megger Instruments Ltd, Dover (GB)

(72) Inventors: Stanislaw Zurek, Dover (GB); Jeffrey Jones, Dover (GB); Freddie Chin, Dover (GB)

(73) Assignee: Megger Instruments Ltd, Dover (GB)

( * ) Notice: Subject to any disclaimer, the term of this patent is extended or adjusted under 35 U.S.C. 154(b) by 96 days.

(21) Appl. No.: 17/812,394

(22) Filed: Jul. 13, 2022

(65) Prior Publication Data

US 2022/0357380 A1 Nov. 10, 2022

Related U.S. Application Data

(63) Continuation of application No. PCT/GB2021/050234, filed on Feb. 3, 2021.

(30) Foreign Application Priority Data

Feb. 5, 2020 (GB) ...................................... 2001539

(51) Int. Cl.
*G01R 27/18* (2006.01)
*G01R 19/10* (2006.01)
*G01R 27/08* (2006.01)

(52) U.S. Cl.
CPC .............. *G01R 27/18* (2013.01); *G01R 19/10* (2013.01); *G01R 27/08* (2013.01)

(58) Field of Classification Search
CPC ........ G01R 27/00; G01R 27/02; G01R 27/08; G01R 27/16; G01R 27/18; G01R 19/00; G01R 19/10

(Continued)

(56) References Cited

U.S. PATENT DOCUMENTS 6,271,668 B1 8/2001 Sehdev et al.
6,288,553 B1 9/2001 Hofstetter et al.
(Continued)

FOREIGN PATENT DOCUMENTS

CN 104880606 A * 9/2015 ............. G01R 27/08
CN 204719136 U * 10/2015 ............. G01R 27/08
(Continued)

OTHER PUBLICATIONS

"Czapp et al: ""A new method of fault loop resistance measurement in lowvoltage systems with residual currentdevices"" 2015 IEEE Eindhoven Powertech, IEEE, pp. 1-5, XP033215354", Jun. 29, 2015.

(Continued)

*Primary Examiner* — Hoai-An D. Nguyen
(74) *Attorney, Agent, or Firm* — EIP US LLP

(57) ABSTRACT

Loop resistance is measured in a live-earth conductor loop comprising a residual current device powered by an alternating current mains supply. A measurement circuit having a low-pass filter characteristic arranged to substantially remove signal components at the frequency of the alternating current mains supply is used to measure, in a first period, a voltage across live and earth conductors of the live-earth conductor loop to determine a first voltage. A current application circuit is used to apply a unipolar test current having a magnitude below a trip current value of the residual current device for a second period and the measurement circuit is used to measure a second voltage between the live and earth conductors. Based on a difference in test current between the first and second periods and a difference in voltage between the first voltage and the second voltage, the resistance of the live-earth conductor loop is calculated.

20 Claims, 14 Drawing Sheets

(58) Field of Classification Search
USPC .................................................. 324/500, 509
See application file for complete search history.

(56) References Cited

U.S. PATENT DOCUMENTS

2007/0063711 A1    3/2007    Smithson et al.
2007/0103168 A1    5/2007    Batten et al.

FOREIGN PATENT DOCUMENTS

| | | | | |
|---|---|---|---|---|
| CN | 206292382 U | * | 6/2017 | ............ G01R 35/00 |
| EP | 295800 B1 | | 7/1992 | |
| EP | 706663 B1 | | 4/1996 | |
| EP | 915347 A2 | | 5/1999 | |
| EP | 1764619 A2 | | 3/2007 | |
| EP | 1950575 A2 | * | 7/2008 | ............ G01R 27/18 |
| EP | 1950575 A2 | | 7/2008 | |
| EP | 1306682 B1 | | 11/2011 | |
| GB | 2292225 A | | 2/1996 | |
| GB | 2413192 A | | 10/2005 | |
| GB | 2408809 B | | 2/2006 | |
| GB | 2430040 A | * | 3/2007 | ............ G01R 27/18 |
| GB | 2430040 B | | 3/2010 | |

OTHER PUBLICATIONS

International Search Report and Written Opinion dated Jul. 28, 2021 for PCT Application No. PCT/GB2021/050234.
Search Report dated Jul. 16, 2020 for GB Application No. GB2001539.2.

\* cited by examiner

MEASURING LOOP RESISTANCE

CROSS-REFERENCE TO RELATED APPLICATIONS

This application is a continuation of International Application No. PCT/GB2021/050234, filed Feb. 3, 2021 which claims priority to GB Application No. GB 2001539.2, filed Feb. 5, 2020, under 35 U.S.C. § 119(a). Each of the above-referenced patent applications is incorporated by reference in its entirety.

BACKGROUND

Technical Field

The present disclosure relates to measuring loop impedance in live earth conductor loops, in particular loop impedance in live-earth conductor loops which comprise a residual current device (RCD).

Background

Electric power is often transported and delivered to premises in the form of mains electricity which is a general-purpose alternating-current (AC) electric power supply. Mains electricity typically has a frequency of 50 or 60 Hertz (Hz) and a voltage between 100 and 240 Volts (V), where the values depend on the country.

The mains voltage is produced by a power transformer and a typical mains electricity system delivers this electricity to premises using three conductors; a live conductor, a neutral conductor, and an earth conductor. The earth conductor is sometimes referred to as a protective earth conductor as it is often used for protecting against electrocution.

The three conductors (live, neutral, and earth) are generally isolated from one another except for their connection to the power transformer and when connected to loads which draw power from the mains electricity supply. Loads which draw power from mains electricity supply may include, for example, lights connected at light sockets or electronic appliances plugged into mains sockets.

Large currents exceeding the intended electrical current in a conductor, may be referred to as over-currents. Over-currents may lead to excessive heat generation in conductors and as such pose a risk of fire and damage to equipment. Over-currents may be caused by short circuits (for example, caused by a failure in insulation of conductors), excessive loads, ground fault issues, and others. Mains power systems typically comprise over-current protection in the form of circuit breakers. Circuit breakers are automatically operated switches which are designed to disconnect electrical circuits when they detect excess currents.

Many modern mains power systems comprise RCDs which are devices designed to quickly and automatically break circuits when imbalances between current in live and neutral conductors are detected. Imbalances between live and neutral connections are often indicators of leakages or short circuits which are sometimes caused by a human receiving dangerous current, and so RCDs may be used to protect against this.

If an over-current exceeds a maximum current rating of a circuit breaker then the over-current may continue to flow without being stopped by the circuit breaker. This can cause damage to the system. In these cases, the current is limited only by the impedance in the wiring or other conductors of the system.

In some territories, regulations are in place which require the testing of systems to estimate the expected amplitude of a fault current if a fault occurs between live and earth conductors. The estimation of the fault current is sometimes referred to as a prospective fault current (PFC). This is done by determining the loop impedance in the live and earth conductor loop of the circuit.

Testing live and earth loop impedance may be performed by applying a high current load to the mains circuit between live and earth conductors and measuring the change in voltage. A high current used may be used such that the change in voltage is distinguishable from the voltage in the mains electricity system. The impedance may then be calculated based on the current and change in voltage. However, in mains circuits comprising RCD protection, the RCDs will trip if a current dangerous to humans (e.g. 30 mA) flows in the live-earth conductor loop.

Different techniques for measuring the loop impedance between live and earth conductors have been developed for testing on RCD protected circuits. One such method is to saturate the magnetic core of the RCD, by applying a saturation current between the neutral and earth conductors, such that a high current load can be applied between live and earth without tripping the RCD. However, some newer types of RCD cannot be saturated to prevent tripping.

Another such method is the three-wire low-current test. This test is carried out in several steps by connecting to all three conductors; live, neutral, and earth. The test begins with applying a high-current load test between the live and neutral conductors (this will not trip an RCD as the current through both the live and neutral conductors will be equal) to determine the impedance of the live and neutral conductor loop ($Z_{L-N}=Z_L+Z_N$). Then a high current load is applied between the live and neutral conductors, but the voltage is measured between the neutral and earth loop, this may be used to determine the impedance of the neutral conductors only ($Z_N$). A low current (so as not to trip the RCD) at mains frequency may then be applied between live and earth conductors and the voltage measured between the neutral and earth conductors to determine the earth conductor impedance ($Z_E$). By addition and subtraction, the impedance of the live and earth conductor loop may be determined ($Z_{L-E}=Z_{L-N}-Z_N+Z_E$).

However, both of these methods require connecting a testing device to all three of the live, neutral, and earth conductors which are not always accessible. For example, in many light sockets the neutral conductor may not be present.

Some techniques utilise only the live and earth conductors. For example, a method is discussed in EP17646192 in which an alternating test current is applied across the phase earth connections of a supply and a plurality of voltage samples are then taken across the connections. The voltage samples are subsequently transformed from time space to frequency space to allow the component due to the test current to be isolated. The loop impedance is then calculated. However, this technique requires close synchronisation between the mains frequency and the measurement hardware.

SUMMARY

In accordance with a first aspect of the present disclosure there is provided a method of measuring loop resistance in a live-earth conductor loop powered by an alternating current mains supply, the live-earth conductor loop comprising a residual current device, the method comprising:

using a measurement circuit having a low-pass filter characteristic, the low-pass filter characteristic being arranged to substantially remove signal components at the frequency of the alternating current mains supply, to measure, in a first period, a voltage across live and earth conductors of the live-earth conductor loop to determine a first voltage;

using a current application circuit to apply a unipolar test current between the live and earth conductors of the live-earth conductor loop for a second period, wherein the unipolar test current has a magnitude below a trip current value of the residual current device;

with the unipolar test current applied, using the measurement circuit to measure, in the second period, a voltage between the live and earth conductors to determine a second voltage;

comparing the first and second voltages to determine a change in voltage; and based on a difference in test current between the first and second periods and a difference in voltage between the first voltage and the second voltage, calculating the resistance of the live-earth conductor loop.

By applying a unipolar test current to the live-earth conductor loop and filtering signals from the live-earth conductor loop using a low-pass filter characteristic the loop resistance in the live-earth conductor loop may be determined without the measurement circuit being synchronised with the power supply to the live-earth conductor loop and with the reactive components of impedance eliminated from the result. It has been found, surprisingly, that sufficient rejection of mains frequency signals and harmonics of mains frequency signals can be achieved by using a unipolar, as opposed to alternating, test signal and a measurement circuit having a low-pass, as opposed to band-pass, filter characteristic.

In an example, the method comprises using the current application circuit to apply an inverse unipolar test current between the live and earth conductors of the live-earth conductor loop, wherein the inverse unipolar test current has a magnitude below the trip current value of the residual current device and flows in the opposite direction to the unipolar test current.

As an alternative, the method may comprise applying no test current between the live and earth conductors of the live-earth conductor loop in the first period. This may simplify test circuitry.

This increases the effective range of the determination of the change in voltage due to the applied test currents, thereby increasing the accuracy of the test, without increasing the risk of tripping the RCD due to the application of a higher test current.

In an example, using the measurement circuit to measure a voltage between the live and earth conductors comprises determining a plurality of voltages and calculating an average voltage based on the plurality of voltages. By calculating the change in voltage based on an average voltage, the reliability of the measurement may be increased.

In an example, at least one of the unipolar test current and the inverse unipolar test current is a series of current pulses, and wherein the amplitude of each of the series of current pulses grows and decays as a half-cycle of sine.

In an example, at least one of the unipolar test current and the inverse unipolar test current is a series of current pulses, and wherein the amplitude of each of the series of current pulses grows and decays as a half-cycle of a square wave. This may provide increased noise rejection as the applied test current may be independent of the amplitude of the voltage of the power supply during the half-cycle pulse.

In an example, using a current application circuit to apply a unipolar test current between the live and earth conductors of the live-earth conductor loop comprises connecting at least a load resistance and a diode across the live and earth conductors of the live-earth conductor loop.

In an example, the signals from the live-earth conductor loop are at least partially filtered with a low pass characteristic by the sampling using the analogue-to-digital converter. This allows the settling time of the filtering system to be lower when compared to filtering using only the filtering system. This allows the measurement to be performed more quickly and may allow current reversals, i.e. swapping between the unipolar test current and the inverse unipolar test current, to be performed quicker.

In an example, the method comprises:
performing the method according to any preceding example on a powered circuit having a predetermined loop resistance, to determine a measured loop resistance; and
determining a correction factor to be applied to the measurement of loop resistance, based at least on a comparison of the measured loop resistance and the predetermined loop resistance.

In an example, measuring the loop resistance of the live-earth conductor loop comprises calculating a first resistance of the live-earth conductor loop and using the correction factor and the first resistance to determine a second, corrected, resistance of the live-earth conductor loop.

In an example the correction factor is a function of the magnitude of the first resistance of the live-earth conductor loop. This allows the measurement of loop resistance to be accurately correct in cases where the loop resistance is not negligible in comparison to the load resistance.

In an example there is provided a method of measuring loop impedance in a powered live-earth conductor loop comprising a residual current device, the method comprising:
measuring loop resistance in the powered live-earth conductor loop comprising a residual current device according to any of the above examples;
using a further measurement circuit to measure a voltage across live and earth conductors of the live-earth conductor loop to determine a third voltage;
using the current application circuit to apply a unipolar test current between the live and earth conductors of the live-earth conductor loop, wherein the unipolar test current has a magnitude below a trip current value of the residual current device;
with the unipolar test current applied, using the further measurement circuit to measure a voltage between the live and earth conductors to determine a fourth voltage;
comparing the third and fourth voltages to determine a change in voltage; and
based on the change in current and the change in voltage between determining the third voltage and determining the fourth voltage, calculating the reactance of the live-earth conductor loop,
wherein using a further measurement circuit to measure a voltage across live and earth conductors comprises:
filtering signals from the live-earth conductor loop with a high-pass filter characteristic; sampling signals from the live-earth conductor loop with an analogue-to-digital converter; and
determining a voltage of the sampled signals.

Thereby it may be possible to calculate the total impedance of the powered live-earth conductor by first measuring the resistance of the powered live earth conductor loop and subsequently by measuring the reactance of the powered live earth conductor loop, or vice versa.

In accordance with a second aspect of the present disclosure there is provided a device for measuring loop resistance in a powered live-earth conductor loop comprising a residual current device, the device for measuring loop resistance comprising:
- a current application circuit for applying a unipolar test current between live and earth conductors of the live-earth conductor loop, wherein the unipolar test current has a magnitude below a trip current value of the residual current device;
- a measurement circuit for measuring a voltage across live and earth conductors of the live-earth conductor loop, the measurement circuit comprising:
- a filtering system having at a low-pass filter characteristic; and
- an analogue-to-digital converter;
- a controller for:
  - controlling the application of the unipolar test current between the live and earth conductors of the live-earth conductor loop;
  - causing the analogue-to-digital converter to sample signals from the live-earth conductor loop; and
  - determining the loop resistance in the live-earth conductor loop based at least on the sampled signals and the magnitude of the unipolar test current.

In an example, the current application circuit comprises at least a load resistance and a diode. The load resistance allows the magnitude of the test current to be maintained below a trip current level of the RCD and the diode may cause the applied test current to be unipolar such that it can be isolated from a power supply to the live-earth conductor loop using the filtering system.

In an example, the load resistance is selectable. This allows the magnitude of the supplied test current to be altered according to a trip current value of an RCD in a live-earth conductor loop under test which allows the device to be used to determine loop resistance in live-earth conductor loops comprising RCDs with different trip current values.

In an example, the current application circuit comprises at least one transistor controllable to pass a current having a predetermined amplitude and a predetermined pulse shape between the live and earth conductors of the live-earth conductor loop. By using a transistor to control the current applied to the live-earth conductor loop, pulse shapes which provide increased noise rejection may be used, for example, using rectangular pulse shapes on live-earth conductor loops connected to sinusoidal power supplies.

In an example, the current application circuit comprises a first current path to apply current to the live-earth conductor loop in a first direction and a second current path to apply current to the live-earth conductor loop in a second direction, and wherein the first direction and the second direction are opposing directions, the current application circuit being reconfigurable between applying a unipolar test current to the live-earth conductor loop in the first direction and the second direction.

In an example, the controller is operable to control the current application circuit to reconfigure between applying current in the first direction and applying current in the second direction. Having two opposing current paths allows the voltage drop, used for determining loop resistance, to be measured over an increased range without applying a higher test current to the live-earth conductor loop which otherwise would increase the risk of tripping the RCD.

In an example, the filtering system is a digital filtering system. Using a digital filtering system may simplify the physical components used in the device and may allow the device to be configured for use on a wider range of live-earth conductor loops.

In an example, the digital filtering system comprises a finite impulse response filter. In an example, the digital filtering system comprises an infinite impulse response filter. In an example, the digital filtering system implements a Fourier Transform function.

In an example, the device comprises at least one voltage divider for modifying a voltage range input to the measurement circuit. Modifying the input range using a voltage divider may allow the device to be used to measure a wide range of resistances.

In an example, the device comprises a variable voltage divider for modifying a voltage range input to the measurement circuit.

Further features and advantages of the present disclosure will become apparent from the following description of preferred examples of the present disclosure, given by way of example only, which is made with reference to the accompanying drawings.

DETAILED DESCRIPTION

Details of examples will become apparent from the following description, with reference to the Figures. In this description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Figure 1:
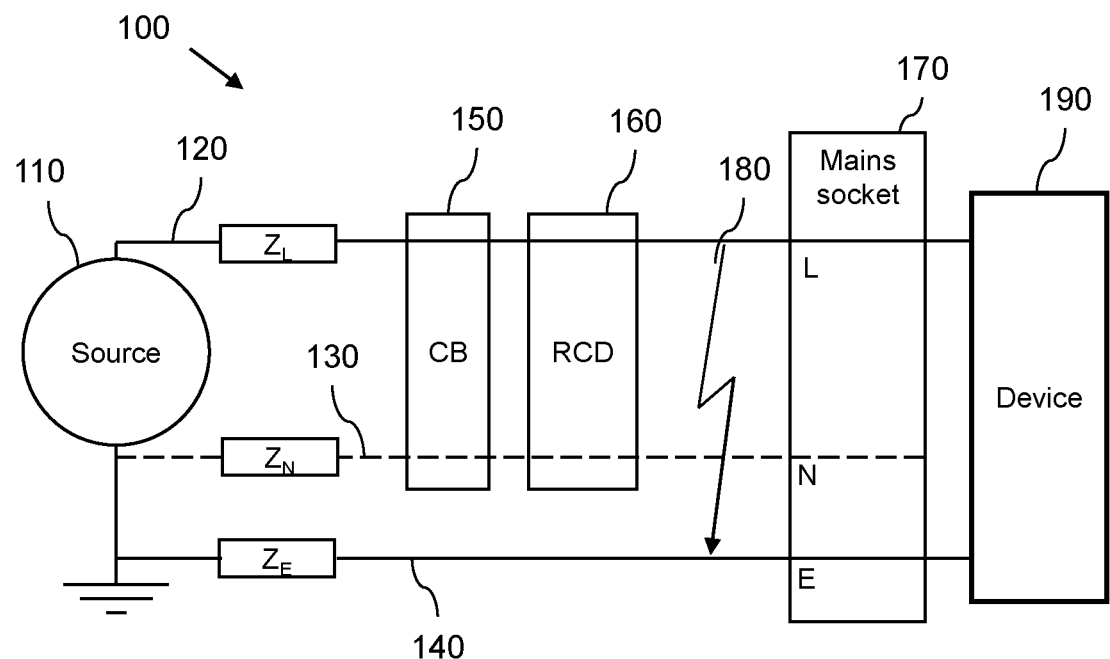
FIG. 1 shows schematically an example of a mains power system.

FIG. 1 shows schematically an example mains power system 100. The mains power system 100 comprises a voltage source 110. The voltage source 110 may be a power transformer delivering electricity at a voltage and frequency of, for example, 230V and 50 Hz respectively. The mains power system 100 comprises three conductive paths: live 120, neutral 130, and earth 140. Each conductive path has an impedance indicated in FIG. 1 as blocks $Z_L$, $Z_N$, and $Z_E$ respectively. The mains power system 100 comprises a circuit breaker 150 connected in the live 120 and neutral 130 conductive paths for detecting over-currents and to subsequently disconnect the system. The mains power system 100 also comprises an RCD 160 connected in the live 120 and neutral 130 conductive paths for breaking the circuit if it detects an imbalance of current between the live 120 and neutral 130 paths. The mains power system 100 comprises a socket 170 which provides connections for electrical devices, for example electronic appliances, to connect to the live 120, neutral 130, and earth 140 conductors. An indication of a fault 180 between the live 120 and earth 140 conductors is shown by an arrow. If a fault 180 develops between the live 120 and earth 140 conductors, then over-currents can be present in the system 100 which exceed the rating of the circuit breaker 150 and damage the system 100.

In the case of over-currents which exceed the rating of a circuit breaker 150, the current is only limited by the impedance in the loop through which it is travelling. For example, in FIG. 1 the fault 180 is shown between the live 120 and earth 140 conductive paths and so the impedance is the sum of the impedances $Z_L$ and $Z_E$. Determining the impedance in the loop provides an indication of the maximum possible fault current which may be present in the system 100. During a fault current the internal impedance of the RCD 160 collapses to a negligible value. However, some RCDs may have significant internal impedance when measured at low currents. Therefore, if a low current test of loop impedance includes the impedance due to the RCD 160 the calculated prospective fault current may be underestimated.

As these tests may be carried out for safety purposes, it is of interest to determine the worst-case scenario for fault currents. Accordingly, this can be determined by a measurement of only the resistive component of the impedance. As the resistance of RCDs may be negligible and as the resistive component of impedance is smaller than the total impedance, the impedance which is determined based on only the resistive components will not be above the actual impedance in the live and earth conductor loop during a fault current incident. This may prevent underestimating prospective fault currents. The prospective fault current in the live-earth conductor loop may be calculated using:

$$I_{PFC} = \frac{V_{L-E}}{R_{L-E}} \qquad (1)$$

where $I_{PFC}$ is the prospective fault current, $V_{L-E}$ is the voltage across the live and earth conductor (generally from the source 110), and $R_{L-E}$ is the resistance in the live-earth conductor loop. If $I_{PFC}$, calculated by equation 1, is below the current rating of the circuit breaker, the system is safe to use. Unaccounted for reactance will elevate the measured impedance in the system and therefore would reduce the prospective fault current value.

A device 190 for testing the live and earth conductor loop impedance according to an example is shown in FIG. 1 which connects to the live 120 and earth 140 conductors. Throughout this description the loop which comprises the live 120 and earth 140 conductive paths may be referred to as the live-earth loop, the live-earth conductor loop, or the L-E loop. When determining the prospective fault current, the impedance of the live-earth loop ($Z_{L-E}$) is determined. Provided that at least the resistive component of impedance is used then the worst-case prospective fault current can be determined. The impedance of the live-earth conductor loop shown in FIG. 1 is equal to the sum of the impedance in the live conductors and the earth conductors ($Z_{L-E}=Z_L+Z_E$).

Figure 2:
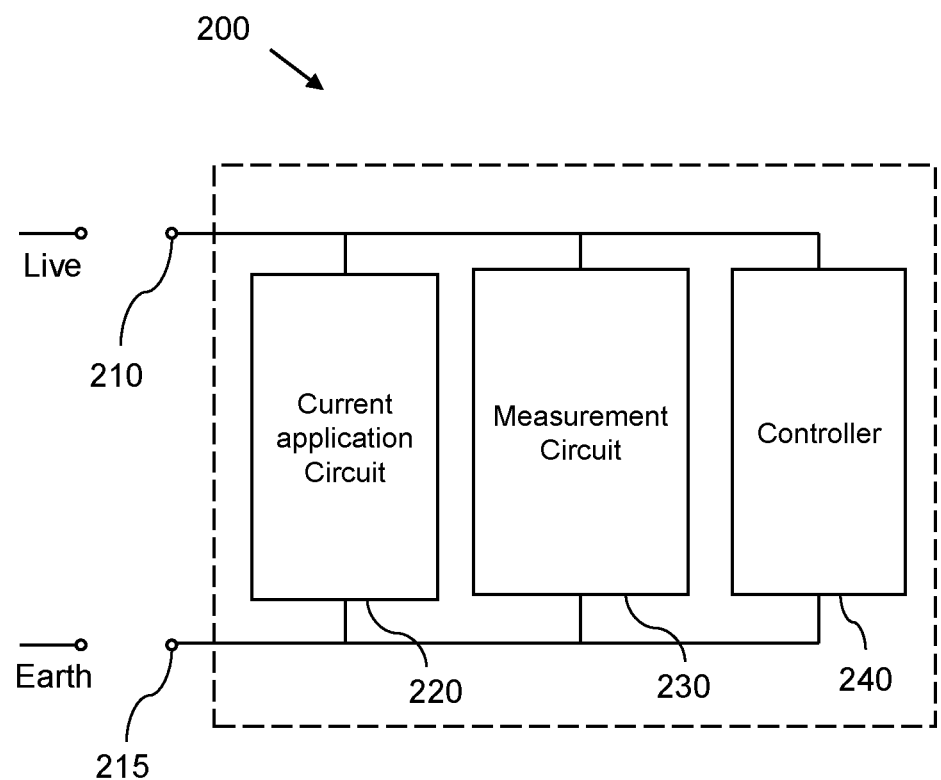
FIG. 2 shows a block diagram of a device according to an example.
Figure 3:
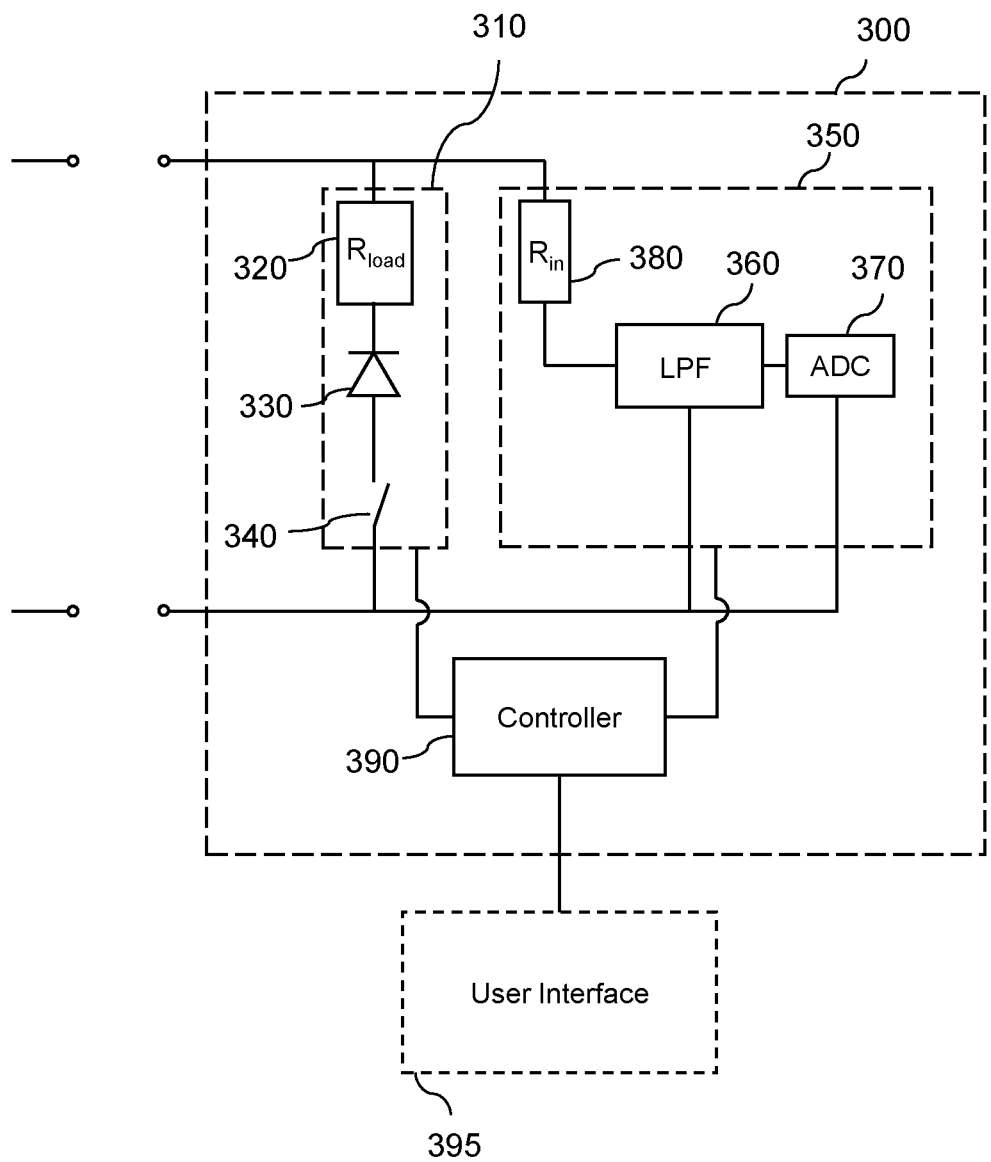
FIG. 3 shows schematically a simplified circuit diagram of a device according to an example.

Examples will now be described in the context of a device for and method of performing a measurement of loop resistance for a prospective fault current test using the live and earth conductors of a mains power system to be tested. In particular, examples will be described of a device which performs a measurement of loop resistance, by at least applying a unipolar test current, below a current magnitude which would trip the RCD, to the live-earth loop and measuring a change in voltage resulting from this current. Measuring the change in voltage comprises using a filter to attenuate the high voltage of the mains power supply and sampling the signals to extract the change in voltage. The filter, and the filter characteristic, is typically low-pass with a monotonic response below the mains power supply frequency, that is to say the frequency of the alternating current mains supply, and is typically arranged to substantially remove signal components at the frequency of the alternating current mains supply. FIGS. 2 and 3 show schematically examples of such a device. By measuring the resistance of the live-earth loop using only the live and earth conductors it is possible to calculate prospective fault currents in installations or outlets where a connection to the neutral conductor is not possible. By using a filter to attenuate the mains power supply and by applying a unipolar current during the test, it is possible to measure the change in voltage without having to synchronise the sampling of the voltage with the mains power supply. This may decrease the complexity of the circuit used to measure the voltage. Similarly, as the mains power supply system is often noisy and has a variable frequency, measurement systems which operate without having to synchronise with the mains power supply may be less prone to erroneous measurements.

In some examples the device applies the current by connecting a load between the live and earth conductors of the mains power system. However, in other examples the current may be injected by a circuit comprising a power supply. Throughout the following disclosure examples of voltages, frequencies, and currents for mains power systems and electrical components are given. However, it is acknowledged that these examples are illustrative and values of voltages, frequencies, and currents, may differ for different electrical components and mains power systems, for example in different countries, and values given herein may differ when applied to different systems accordingly.

Figure 11:
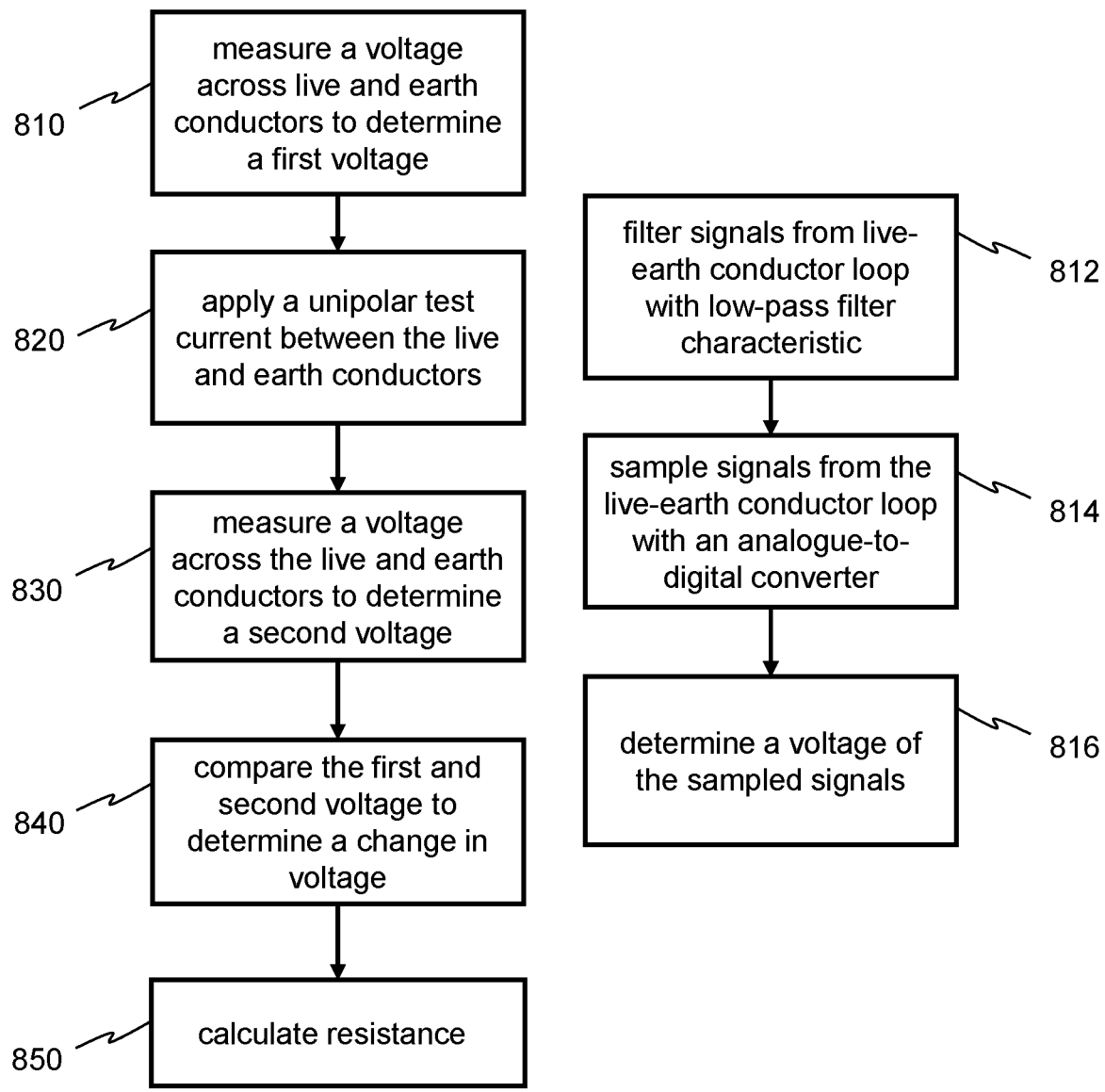
FIG. 11 shows a flow diagram of a method according to an example.

In an example, a method of measuring loop resistance is provided. This comprises applying at least a unipolar test current having a magnitude below a trip level of the RCD and measuring a resultant change in voltage across the live and earth conductors of a mains power system to be tested. In an example, the change in voltage is the change from the case where no test current is applied. The period where no current is applied may be before or after the period when the test current is applied. FIG. 11 illustrates an example of this method. The method employs a filtering system to attenuate the signals at mains power supply frequencies and other components used to determine the change in voltage. Another example of this method is described further, wherein a unipolar test current is applied in the opposite direction to the original unipolar test current when measuring a first voltage and the change in voltage, used to determine resistance, is the difference between the change in voltage resultant from applying each unipolar test current. This may increase the effective range of the measurement but also maintains the applied current below the RCD trip current value.

Returning to FIG. 2, this Figure illustrates a device 200 for measuring loop resistance in a powered live-earth conductor loop comprising an RCD. Although the actual fault current of a live-earth fault is limited by the total impedance in the live-earth loop, a measurement of the resistive component of impedance is useful as it may indicate a worst-case scenario of fault current. If a prospective fault current, calculated with only the resistive component, is below a circuit breaker maximum current rating, then the actual current which would develop from a fault will also be below this rating as the components of impedance not included in the calculation will increase the overall impedance. The device discussed throughout this disclosure may determine or be used to determine the resistive component of impedance. However, a negligible amount of the reactive component of impedance may also be included in this measurement.

The device 200 shown in FIG. 2 comprises connection points 210 and 215 for connecting the device to live and earth conductors of the circuit. The connection points 210 and 215 of the device may comprise electrical connection apparatus, for example, crocodile clips, banana plug connectors, power plugs, or other suitable electrical connection apparatus. The type of electrical connection apparatus may depend on the part of the circuit which is to be tested. In some examples, the live and earth conductors of the circuit to be tested may be exposed conductive surfaces. For example, exposed conductors in a threaded light socket. In other examples the live and earth conductors to which the device 200 is connected for testing may be electrical contacts inside a plug socket, for example, sprung receiving conductors for electrically connecting with plug pins. In some examples, the device 200 may comprise detachable connection apparatus. For example, the device 200 may comprise leads which are connectable to the connection points 210 and 215. The leads may comprise electrical probes, crocodile clips, or plugs which can be used to electrically connect with the live and earth conductors of the circuit to be tested.

The device 200 may comprise a current application circuit 220 for applying a unipolar test current between live and earth conductors of the live-earth conductor loop. The unipolar test current having a magnitude below a trip current value of the RCD. As discussed above, RCDs are designed to disconnect a circuit when they detect current imbalances between the live and neutral conductors which may be dangerous to humans. However, not all RCDs have the same trip current value. In an example, a trip current value for an RCD is 100 miliamps (mA). In another example, a trip current value for an RCD is 10 mA. For simplicity, in examples described herein a trip current value of 30 mA will often be referenced. However, it is acknowledged that the trip current value may differ from this value, and accordingly, other values which are calculated based on this will be different. To reduce the chance of the applied current exceeding the trip current value, the root mean square of the applied current may be less than or equal to half the magnitude of the RCD trip current value. For example, if an RCD has a trip current value of 30 mA, the root mean square of the applied current may not exceed 15 mA.

The device 200 may comprise a measurement circuit 230 for measuring the voltage across the live and earth conductors of the live-earth conductor loop. Applying a test current between the live and earth conductors of the live-earth conductor loop will cause the voltage between the live and earth conductors to drop. It is possible using the predetermined test current, and the voltage drop to determine the resistance $R_{L-E}$. However, as the test current has a small magnitude, below the RCD trip current value, the resultant drop in voltage will also be small Consequently, there may be difficulty in distinguishing the voltage drop from the cycling AC voltage, due to the power supply, when measuring voltage. The measurement circuit 230 may comprise a filtering system having a low-pass filter characteristic. The filtering system may be used to attenuate the mains power supply frequency signals such that the voltage drop due to the applied test current can be extracted. The measurement circuit may comprise an analogue-to-digital converter (ADC). The ADC may be used to sample signals from the live-earth conductor loop. Sampling signals using the ADC may be performed before the signals pass to the filtering system or may be performed after the signals have been filtered by the filtering system. In some examples, the ADC forms part of the filtering system although this will be explained further later.

The device 200 in FIG. 2 may comprise a controller 240. The controller 240 may be used to control the application of the unipolar test current between the live and earth conductors of the live-earth conductor loop. The controller 240 may comprise any combination of hardware and program code for performing the function described herein. The controller 240 may cause the analogue-to-digital converter to sample signals from the live-earth conductor loop and may determine the loop resistance of the live-earth conductor loop based at least on sampled measured signals and the magnitude of the unipolar test current. For example, the controller 240 may control the magnitude, direction, and pulse shape of the test current applied to the circuit. The controller 240 may then cause the measurement circuit to measure the voltage drop due to the test current. From the test current, and the voltage drop the controller 240 may determine the resistance. The load circuit 220, measurement circuit 230, and the controller 240 may comprise multiple electrical components to perform this function, as will be described below.

FIG. 3 shows a more specific schematic diagram of an example device 300 than the example shown in FIG. 2. In the example of FIG. 3, the current application circuit 310 applies the current by electrically connecting the live and earth conductors of the circuit to be tested. The current application circuit 310 may comprise at least a load resistance 320 and a diode 330. The load resistor 320 may be used to prevent the applied current from exceeding the trip current value of the RCD, the load resistor has a load resistance $R_{load}$. For example, where the mains voltage supply is 230V the load resistor 320 may have a load resistance ($R_{load}$) of 15.6 kiloohms (kΩ) such that the resultant current will be below 15 mA.

In some examples, the load resistance may be selectable. This may be used to modify the magnitude of the applied test current. This may allow the current application circuit to be used to apply a current to live-earth conductor loops comprising RCDs with different trip current values. In other examples, the current application circuit 310 may use active components to apply test currents to the live-earth conductor loop, for example, using a powered transistor, controllable to pass a specific amount of current, independent of the supply voltage. In some examples the current application circuit 310 may comprise at least one transistor controllable to pass a current having a predetermined amplitude and a predetermined pulse shape between the live and earth conductors of the live-earth conductor loop. This may allow the test current to be purely sinusoidal even in situations where the signals from the mains power supply are distorted. Using a current application circuit which comprises components to actively apply a test current may also allow test currents having different pulse shapes to be applied between the live and earth conductors, for example rectangular current pulses may be used.

To cause the applied current to be unipolar, the load circuit 310 may comprise at least one diode 330. The unipolar test current may be a series of current pulses and the amplitude of each of the series of current pulses may grow and decay as a half-cycle of sine. As the mains power supply is an alternating current and the current application circuit 310 comprises a diode 330, the current may only be applied during half of each cycle of the mains power supply. This causes the applied test current to be a series of half cycle pulses. For example, where the mains power supply is sinusoidal the half cycles of current will be half cycles of sine. In examples where the current application circuit actively applies the current the current application circuit may actively apply the unipolar test current as a series of current pulses wherein the amplitude grows and decays as a half cycle of sine even in cases where the mains power supply is not sinusoidal. The current application circuit 310 may comprise at least one switch 340 to selectively apply the current to the live-earth conductor loop when the current application circuit 310 or the device 300 is attached to the live earth conductor loop. This may allow the device 300 to be connected to the live-earth conductor loop without a unipolar test current being applied to the circuit.

When the unipolar test current is applied to the live-earth conductor loop, the voltage across the live and earth conductors will drop. The magnitude of the voltage drop is related to the applied test current and the impedance in the live-earth conductor loop and so by measuring the drop in voltage it is possible to determine the loop resistance of the live-earth conductor loop.

To determine the loop resistance in the live-earth conductor loop the device may comprise a measurement circuit 350 comprising a filtering system 360, an analogue-to-digital converter (ADC) 370, and an input resistor 380. The measurement circuit 350 will be described in more detail later. The device may comprise a controller 390 for controlling the current application circuit 310, the measurement circuit 350, and for determining the loop resistance of the live-earth conductor loop. In some examples, the device may comprise a user interface 395, to allow operation of the device by a user.

Figure 4A:
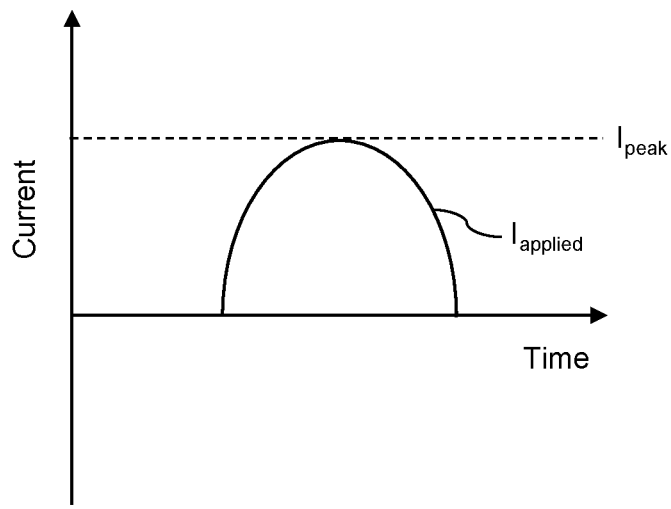
FIG. 4a shows a graph of current against time for a single half cycle of applied current according to an example.
Figure 4B:
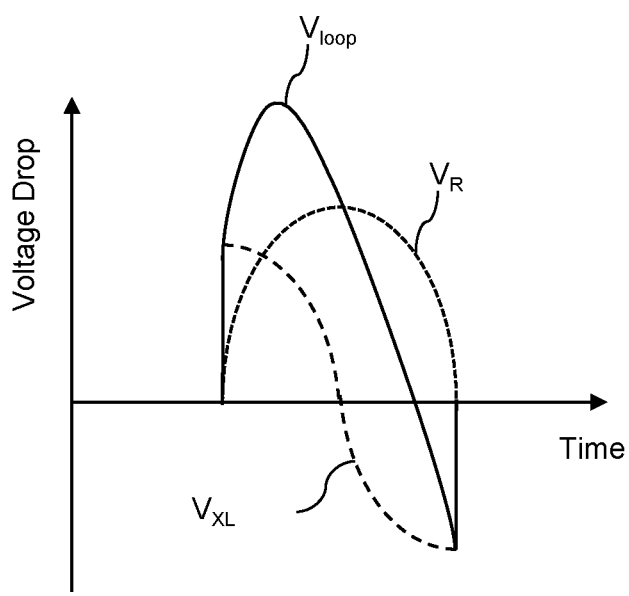
FIG. 4b shows a graph of voltage drop against time resulting from a half cycle of applied test current due to impedance according to an example.

FIG. 4a shows an example of a single half cycle of applied current. The applied current in this example is a half cycle of sine. The applied test current ($I_{applied}$), has a peak value of $I_{peak}$. The voltage-drop in the live-earth conductor loop, when the test current is applied, can arise from both resistive and reactive components of loop impedance. FIG. 4b shows the voltage drop due to both the resistive and reactive components as well as the total voltage drop. The instantaneous voltage-drop due to the resistive components of impedance ($V_R$) grows and decays in accordance to the applied test current. Whereas, the voltage-drop due to reactive components ($V_{XL}$), over the same period of time, is a half cycle of cosine. The total voltage-drop in the loop ($V_{loop}$) may be expressed as the sum of the resistive component ($V_R$) and the reactive component ($V_{XL}$) of the voltage drop:

$$V_{loop} = V_R + V_{XL} \tag{2}$$

It can be seen from FIG. 4b that the average of the reactive component ($V_{XL}$) over a single half cycle is zero. Whereas, the average of the resistive component ($V_R$) is non-zero and hence an average of the total voltage-drop over a half cycle gives a value which is directly proportional to the average of the voltage-drop due to the resistive component.

Figure 5:
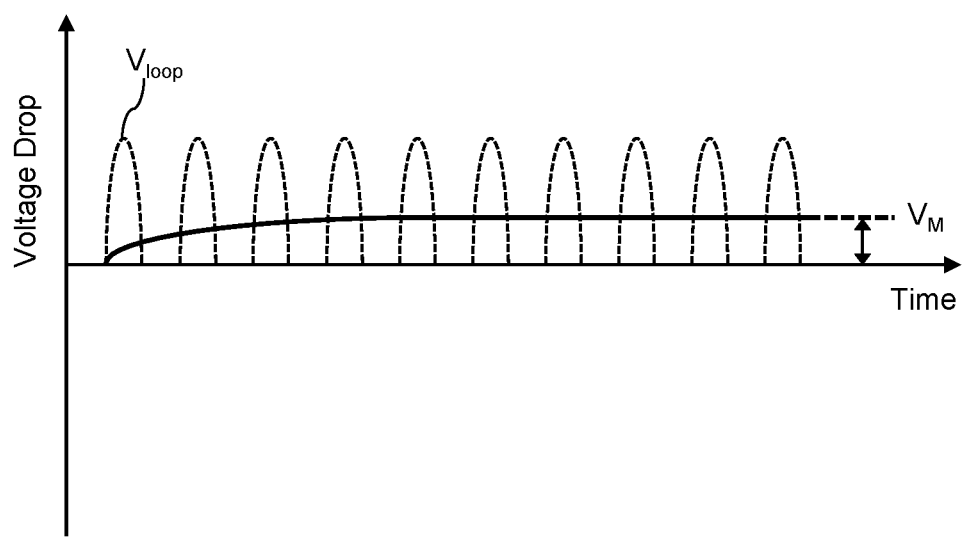
FIG. 5 shows a graph of voltage drop against time resulting from a series of half-cycle current pulses according to an example.

As the average of the voltage-drop is directly proportional to the voltage drop due to the resistive component and because the instantaneous voltage-drop due to the resistive component has the same shape as the applied current, the voltage-drop is also a series of half cycles. FIG. 5 shows the voltage drop ($V_{loop}$) due to a series of half cycles of applied test current against time. FIG. 5 also shows a solid line which rises to a value $V_M$ which is representative of an average voltage drop value over the period, this will be explained further below.

Returning to FIG. 3, in an example, the filtering system 360 has a low-pass filter characteristic. The filtering system 360 may comprise a low pass filter comprising resistors and capacitors to passively filter the signals. In other examples, the filtering system 360 may comprise an active low-pass filter comprising op-amps. Using op-amp based filtering systems may increase the effectiveness of attenuation and may provide faster response times than passive filtering systems comprising resistors and capacitors. The filtering system may be configured as, for example, a Butterworth, Chebyshev, Sallen-Key, or another type of filter. The low-pass filtering characteristic of the filtering system 360 may be configured to attenuate the signals at mains frequency, for example at 50 Hz, and the associated harmonics which may develop from the mains power supply. Harmonics in the power supply may arise from non-linear loads connected to a mains power system, for example switched-mode power supplies, variable speed drives, and other non-linear loads. The filtering system 360 may be used to filter signals from the live and earth conductors and may attenuate the 50 Hz component of signals (due to the mains power supply frequency) to extract the average value of the voltage drop. Turning back to FIG. 5, this average value is indicated using a solid line showing the average voltage drop value $V_M$. The averaging of this value may occur over many cycles, wherein the test current is applied, and therefore the voltage drop is present, in only one half of each cycle. The average value $V_M$ may be measured as a unipolar signal. In examples where the signal has a sinusoidal characteristic as shown in FIGS. 4a, 4b, and 5, the average value $V_M$ may be expressed as:

$$V_M = \frac{I_{peak} R_{L-E}}{\pi} \tag{3}$$

where $I_{peak}$ is the peak magnitude of the applied test current, $V_M$ is the average voltage drop value, and $R_{L-E}$ is the resistance in the live-earth loop. A scaling factor of $\pi$ is used in equation 3 due to the sinusoidal shape of the half cycle pulses. However, a different scaling factor may be used depending on the applied test current which may be dependent on or independent of the mains power supply. Appropriate calibration may be used to determine a different scaling factor. The scaling factor may be predetermined based on the current application circuit. For example, if the current application circuit applies a test current having a sinusoidal shaped then the scaling factor of $\pi$ may be used, whereas if the current application circuit applies a test current having a square wave shape then a different scaling factor may be used. If the scaling factor cannot be predetermined, for example, where the test current is applied by connecting at least a diode and a resistor across the live and earth conductors, and the mains power supply is not sinusoidal, then a similar result may be achieved by averaging or calculating RMS values of voltage and current. Other effects can be accounted for by performing a calibration of the device. For example, gain, offset, non-linearity may all be accounted for by calibrating the device.

As discussed above, the test current applied to the circuit has a magnitude below the trip current value of the RCD (e.g. 30 mA). This means that the voltage drop in the circuit due to this current will be very small in comparison to the voltage supplied by the mains power supply. For example, applying a test current of 15 mA and using an example resistance $R_{L-E}$ of 10Ω, then by equation 3 the measured voltage drop will be roughly 50 mV. It would be difficult to distinguish a voltage drop of 50 mV when the mains voltage is around 230V, as this would require a resolution of 0.02%. It is because of this that large attenuation of the mains voltage is needed.

In some examples, the filter may be capable of attenuating more than 80 decibels (dB) of the mains frequency signals, for example 50 Hz frequency signals, and harmonics associated with these signals. In an example, this may be achieved using an active filter comprising op-amps, for example, an op-amp based low-pass filter as discussed above.

The ADC 370 may be used to sample signals from the live-earth conductor loop. In some examples the ADC 370 samples signals from the live-earth conductor loop output from the filtering system 360. As discussed above due to the high attenuation of the mains frequency signals by the filtering system 360 and as the test current is unipolar, the output from the filtering system 360 is effectively a unipolar signal and is measured as such by the ADC 370. The average measured value is shown in FIG. 5 as the value $V_M$. As the signal sampled by the ADC 370 does not have a varying polarity and because the filter substantially attenuates any mains frequencies and associated harmonics, the ADC 370 can sample the signals and determine the voltage drop without having to synchronise the sampling of the signals with the cycle of the mains power supply. This may reduce the complexity of the circuitry involved and reduces the inconsistency in measurements which may arise due to the variable nature of mains power supply frequency signals.

In some examples, attenuation of the signals at mains frequency may be caused by the combined effect of the attenuation due to the filtering system 360 and attenuation from the rest of the measurement circuit 350. Some attenuation may be provided by the calculation algorithms used for signal processing. By reducing the amount of attenuation provided by the filtering system 360, the filtering system 360 may have a lower settling time which may allow measurements of voltage to be performed quicker.

In some examples, the ADC 370 provides at least some of the attenuation of the signals at mains frequency. In one such example, the filtering system 360 may provide 50 dB or more attenuation and additional attenuation may be provided by the ADC 370. For example, the ADC 370 may be an ADC 370 designed to have high rejection of the mains frequency signals, for example, 50 Hz. This may be achieved by using an ADC 370 with a low sampling rate compared to the mains power supply frequency, for example, the ADC 370 may take a reading every 150 milliseconds (ms) equivalent to roughly 6 Hz. In other examples, the sampling rate of the ADC may be below 6 Hz, for example 3 Hz. In some examples, the output from the ADC 370 may be averaged, filtered, or a combination of these and/or other processes, to extract the information relating the voltage drop caused by the applied current.

In other examples, the ADC 370 may have a fast sampling rate in comparison to the mains frequency signal, for example, a sampling rate of 1000 Hz. By synchronising the sampling of the ADC 370 with the mains signal and averaging the output of the ADC 370, it may be possible to attenuate the mains frequency signals and suppress noise.

The resistance $R_{L-E}$ of the live-earth conductor loop can be determined by rearranging equation 3 to:

$$R_{L-E} = \frac{V_M \pi}{I_{peak}} \tag{4}$$

and then using the $V_M$ voltage drop value determined by the measuring circuit 350, wherein the voltage drop is caused by the applied test current with a peak current $I_{peak}$.

To protect the measurement circuit 350 from the potentially high currents due to the mains power supply, which for example may have a voltage of 230V, the measurement circuit 350 may comprise an input resistor 380 having a high resistance value $R_{in}$, for example a resistance of 1 MΩ or higher. This may be used to limit the current passing to the measurement circuit 350 to improve the safety of the operation of the device 300.

In some examples the device 300 may comprise at least one voltage divider for modifying a voltage range input to the measurement circuit. The device 300 may be configured to switch between the voltage dividers depending on the level of the input signal. This may allow the device 300 to be used to measure a wider range of resistances, for example from 0.001 ohms to 2000 ohms. In other examples, the device comprises a variable voltage divider for modifying a voltage range input to the measurement circuit. For, example the at least one voltage divider may be variable such the applied test current may be substantially the same, but the processing of the output signal may be different depending on the resistance of the live-earth conductor loop. Switching between voltage dividers or controlling a variable voltage divider may be performed by the controller 390.

The device 300 shown in FIG. 3 comprises a controller 390. The controller 390 may be used to control the load circuit 310. For example, the controller 390 may be used to control the application of the unipolar test current to the live-earth conductor loop. The controller 390 may be used to control at least one switch 340 to selectively apply the test current between the live and earth conductors of the live-earth conductor loop. In other examples, the controller 390 may control other parts of the circuit. The current application circuit may comprise circuitry for changing the value of the load resistor, such that the magnitude applied test current can be changed as discussed above. The controller 390 may be used to select the resistance $R_{load}$. In other examples, such as where the current application circuit actively applies a current by means of a powered transistor, the controller 390 may control any suitable part of the current application circuit to control the application of a test current to the live-earth conductor loop.

The controller 390 may be used to control the measurement circuit 350. For example, during a measurement process, once the current application circuit 310 has begun applying the unipolar test current to the live-earth conductor loop to be tested, the controller 390 may cause the measurement circuit to make a measurement of voltage drop. In an example, once an elapsed time from a beginning of the application of the unipolar test current is equal to or greater than the settling time of the filter, the controller may cause the analogue-to-digital converter to sample voltage signals output from the filter.

Once the settling time of the filter has elapsed since the beginning of the application of the test current, then the measured value $V_M$ is measurable. Returning to FIG. 5 it can be seen that the value $V_M$ rises to a stable value after a settling time of the filter. The controller 390 may, based on the sampled voltage signals and the magnitude of the applied test current, determine the loop resistance in the live-earth conductor loop.

The user interface 395 may be used to operate the device via the controller 390. For example, the user interface 395 may be used to commence or end a measurement of loop resistance of the live-earth conductor loop. The user interface 395 may comprise a display for indicating the state of a measurement of loop resistance and for controlling the measurement of loop resistance. For example, the user interface 395 may indicate that a measurement of loop resistance is in progress, and upon completion may display the resulting value of the measurement. The user interface 395 may comprise an input device, for example, a touchscreen, at least one button, a camera, a microphone, or any other suitable input device to allow the device 300 to be controlled by a user. In some examples, the user interface 395 may be used to select parameters relating to the unipolar test current, for example, the magnitude, frequency, pulse, and any other suitable variable.

In some examples, the filtering system may be a digital filtering system, for example, sampled signals are filtered using digital signal processing. In examples where the filtering system is a digital filtering system the ADC may be used to sample signals from the live and earth conductors and the digital output from the ADC may be processed digitally to isolate the voltage drop from the mains voltage power supply. In some examples, the ADC may be connected to the live and earth conductors via an input attenuator, and a voltage buffer. In some examples, the range of the signals may also be modified before being sampled by the ADC.

In some examples where the filtering system is a digital filtering system, the filtering system may comprise a finite impulse response filter. In other examples, the filtering system may comprise an infinite impulse response filter. In some examples the filtering system may implement a Fourier Transform function to determine the voltage drop due to the applied test current.

In an example, determining the loop resistance in the live-earth conductor loop may be performed by measuring the voltage drop for a current in one direction due to the unipolar test current and then measuring the voltage drop for a current in a second direction with an inverse unipolar test current, wherein the inverse unipolar test current flows in the opposite direction through the live-earth conductor loop than the original unipolar test current.

Figure 6:
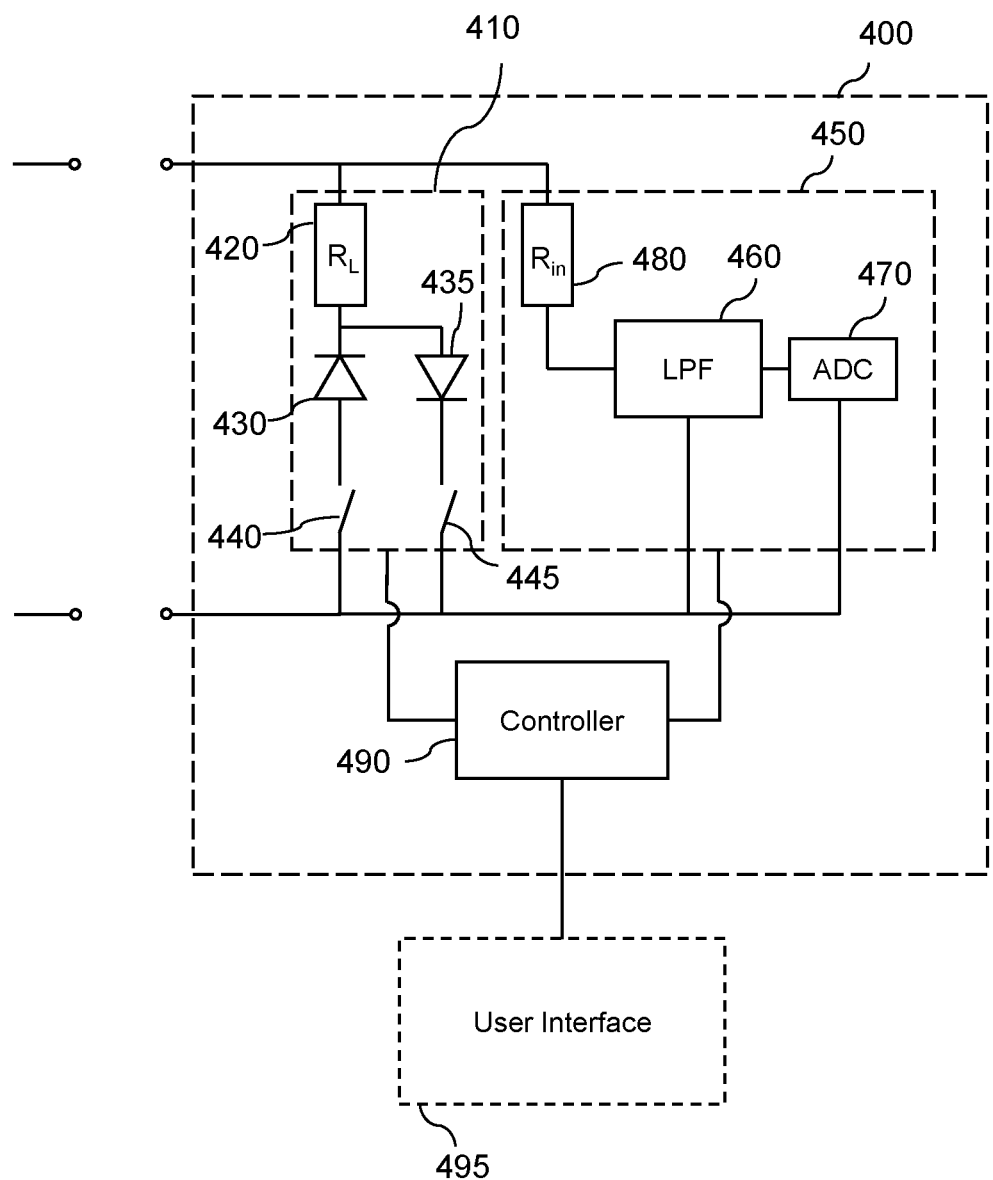
FIG. 6 shows schematically a simplified circuit diagram of a device according to a further example.

FIG. 6 shows schematically an example device 400 for measuring loop resistance in a powered live-earth conductor loop comprising a residual current device by applying unipolar test currents in opposing directions and measuring the resultant voltage drops. The device 400 comprises a current application circuit 410. The current application circuit comprises a load resistor 420. The current application circuit 410 comprises a first current path to apply current to the live-earth conductor loop in a first direction and a second current path to apply current to the live-earth conductor loop in a second direction, wherein the first direction and the second direction are opposing directions, the current application circuit 410 being reconfigurable between applying the unipolar test current to the live-earth conductor loop circuit in the first direction and the second direction. The first current path being provided by a first diode 430 and a first switch 440. The second current path being provided by a second diode 435 and a second switch 445, wherein the first diode 430 and the second diode 435 are configured within the current application circuit 410 such that they allow the flow of current in opposing directions.

The device 400 may comprise a measurement circuit 450 comprising a filtering system 460, an ADC 470 and an input resistance 480 to protect the measurement circuit 450 from dangerous currents. In this example, the filtering system may be a filtering system having a low-pass filter characteristic. The device 400 may comprise a controller 490 for controlling the current application circuit 410, the measurement circuit 450, and to determine the loop resistance in the live-earth conductor loop under test. The controller may control the current application circuit 410, for example by controlling the switches 440, 445, to alternate between applying a test current in the first direction and the second direction.

The device 400 may comprise a user interface 495 for controlling the device 400 including controlling the measurement of loop resistance and for displaying a result. The user interface 495 may be implemented as any suitable combination of hardware and program code to allow a user to operate the device 400.

Figure 7:
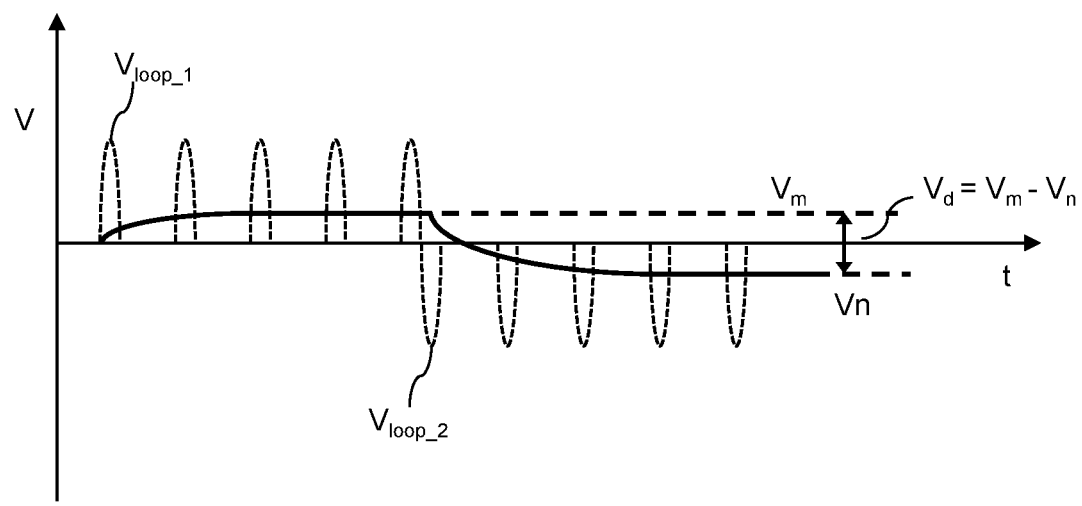
FIG. 7 shows a graph of voltage drop against time resulting from a series of half-cycle current pulses according to a further example.

With a test current applied to the live-earth conductor loop, the measurement circuit 450 may measure the voltage drop caused by the applied test current. Subsequently with the test current applied to the live-earth conductor loop in an opposite direction, the measurement circuit 450 may measure the voltage drop caused by this subsequently applied test current. FIG. 7 shows an example of the half cycles of voltage drop $V_{loop\_1}$ caused by the application of a test current in the first direction and subsequently the half cycles of voltage drop $V_{loop\_2}$ caused by the application of a test current in a second direction, wherein the two currents have an equal magnitude. With the first test current applied to the live-earth conductor loop under test, the filtering system 460 and the ADC 470 may be used to extract a value $V_m$ indicating the average voltage drop during the application of the first current. With the second test current applied, in the opposite direction, the filtering system 460 and the ADC 470 may be used to extract a value $V_n$ indicating the average voltage drop caused by the application of the second test current. As shown in FIG. 7 the voltage drop values $V_m$ and $V_n$ may have opposite magnitudes due the respective applied test currents having opposite directions, and the difference between these values may be calculated $V_d=V_m-V_n$. The resistance of the live-earth conductor loop under test, may be determined using the following equation:

$$R_{L-E} = \frac{(V_m - V_n)\pi}{2I_{peak}} \quad (5)$$

where equation 5 may be used in the case that the currents applied in the first and second direction have equal magnitude such that the factor of 2 is used to account for the total difference in the applied currents. As before a scaling factor of $\pi$ is used, but this factor may be different or other scaling factors may also need to be applied, for example, where the applied test currents are not sinusoidal. In some examples the ADC 470 may be a bipolar ADC. In other examples the ADC 470 is a unipolar ADC and a bias circuit may be used to change the range of the measurements, such that both $V_m$ and $V_n$ are positive or negative values. As the calculation of $V_d$ is a subtraction of the two values any offsets in voltage will be eliminated when calculating $V_d$. Performing the measurement by applying currents in each direction sequentially and measuring the total difference in voltage may be used to increase the total measured change in voltage and therefore increase the reliability of the test without tripping the RCD. For example, a 15 mA current may be applied in each direction sequentially, such that the effective total applied current is 30 mA. However, as neither of the applied unipolar nor inverse unipolar test currents exceed 15 mA, an RCD having a trip current value of 30 mA will not be tripped when each test current is applied.

Figure 8:
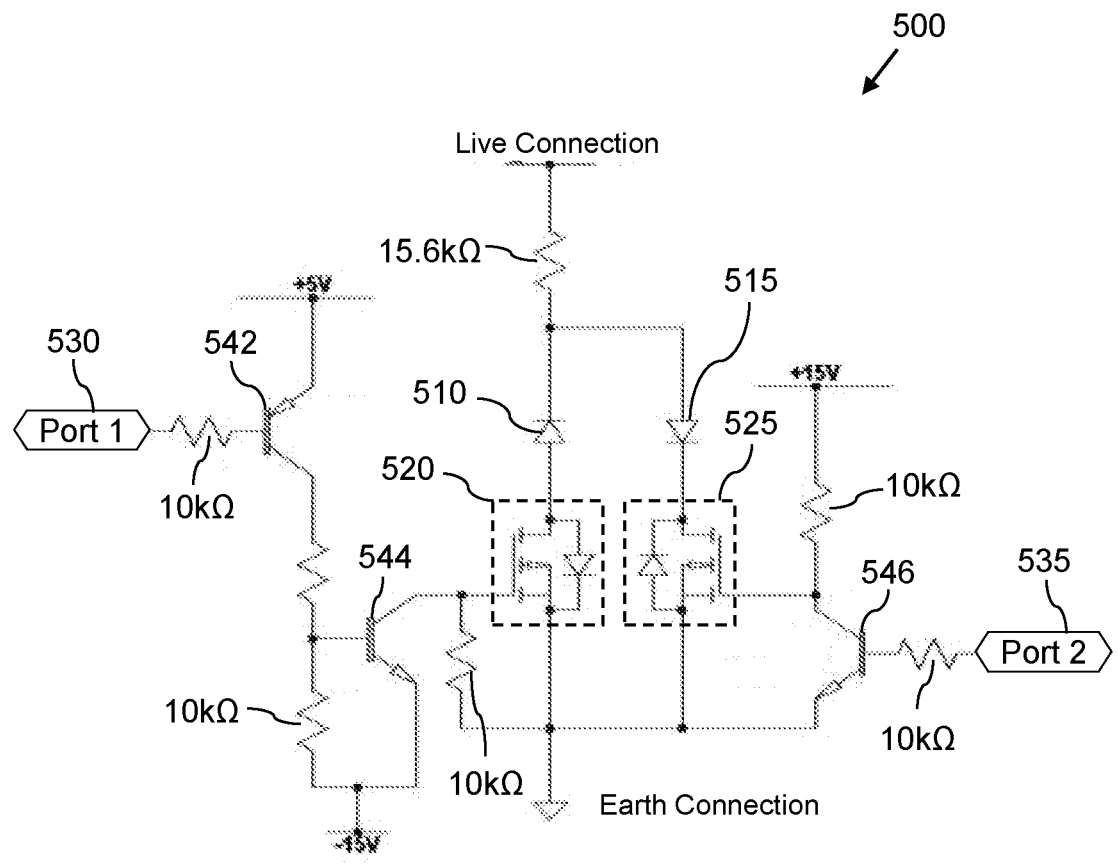
FIG. 8 shows a circuit diagram of a current application circuit according to an example.

FIG. 8 shows a circuit diagram of one example current application circuit 500 connected between live and earth conductors of a live earth conductor loop to be tested. The circuit 500 comprises a first current path and a second current path. The first current path being between the live connection and the Earth connection and comprising a diode 510 and a MOSFET 520. The second current path being between the live connection and the earth connection and comprising a diode 515 and a MOSFET 525. The MOSFETs 520, 525 act as switches such that by operating a respective port 530, 535 the current application circuit 500 may be configured to pass current through either the first current path or the second current path respectively. Additional bipolar transistors, 542, 544, and 546, may be included in circuit 500 and used as gate drivers for the MOSFET transistors 520 and 525. FIG. 8 indicates some non-limiting examples of voltage and resistance values of the circuit 500. However, other examples of resistances and voltages may differ depending on the exact implementation of the circuit and the application of the circuit.

Figure 9:
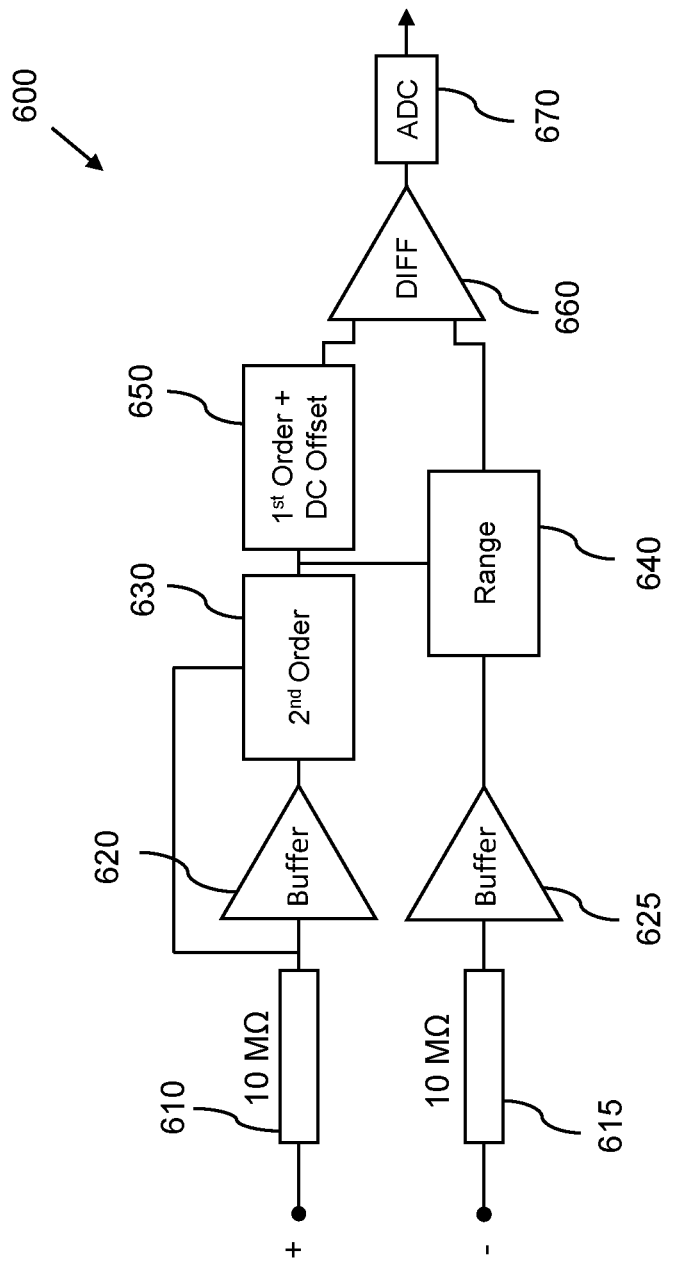
FIG. 9 shows a simplified circuit diagram of a filtering system according to an example.

FIG. 9 shows a simplified block diagram of a circuit 600 implementing the filtering system according to an example. The circuit 600 implementing the filtering system comprises two 10 megaohm resistors 610 and 615. The first resistor 610 being connected to the live conductor and a first buffer 620. The second resistor 615 is connected to the earth conductor and a second buffer 625. The circuit comprises a range change block 640 which attenuates the recovered signal by 10 and may allow high resistance values to be measured. The circuit 600 comprises a second order filtering block 630 and a first order filtering block 650 comprising a DC offset. The DC offset may be used to shift the zero voltage signal up to half of the input range of the ADC 670.

Figure 10:
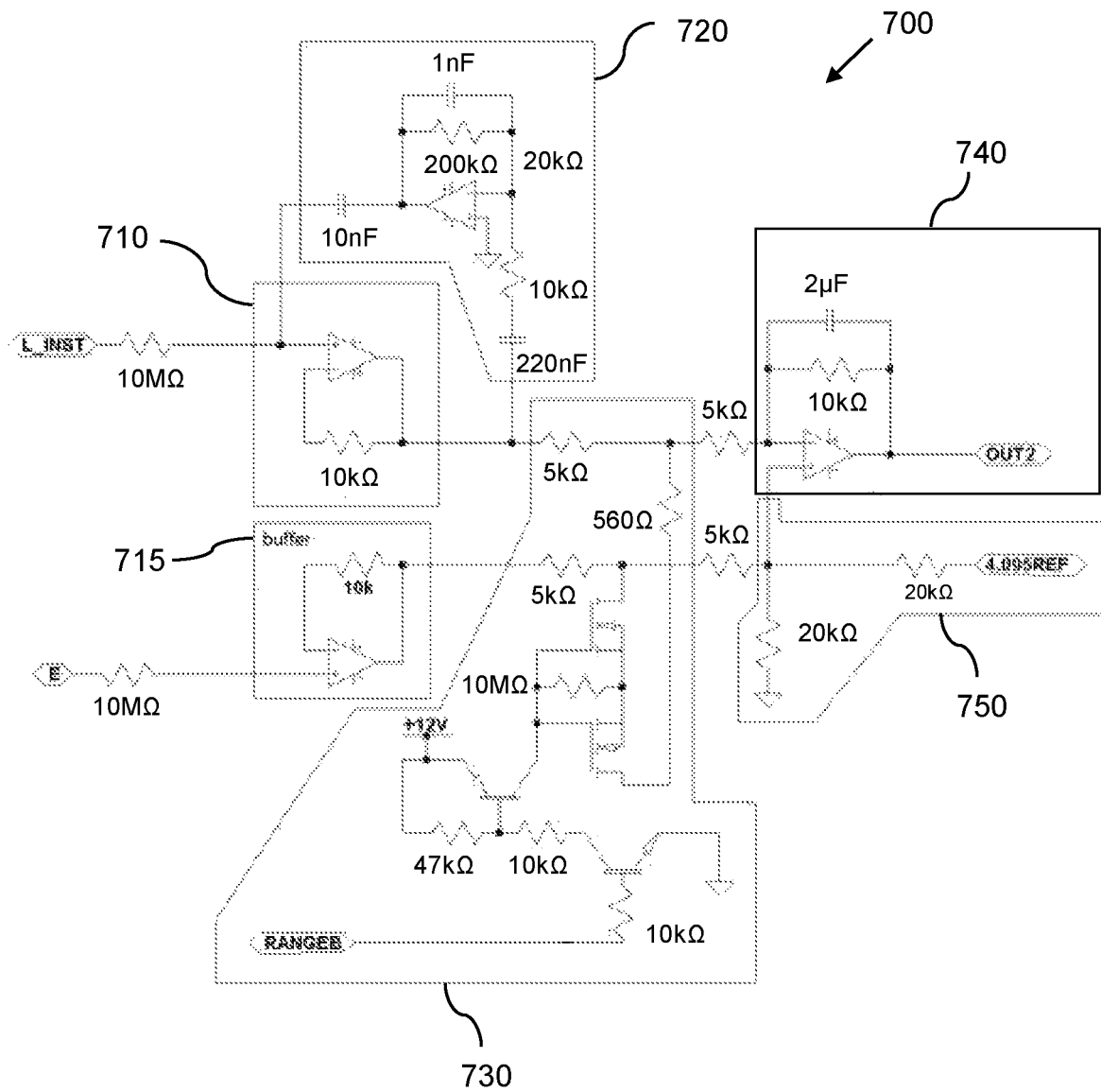
FIG. 10 shows a circuit diagram of a filtering system according to an example.

FIG. 10 shows a detailed example of a circuit diagram 700 implementing the filtering system. The different parts of the circuit diagram 700 are indicated in boxes in FIG. 10. The different parts include: a first buffer 710, a second buffer 715, a second order filter 720, a first order filter and combined differential amplifier 740, a range change circuit 730, and a DC offset 750. When connected in the device, the current application circuit may be connected in parallel between L_INST and E (live and earth). Example values for the resistors and capacitors are given in FIG. 10, which may be used when using the device to measure loop resistance of a live-earth conductor loop in a mains power system having a supply voltage of 230V and a frequency of 50 Hz. However, these examples are non-limiting and other values may be used depending on the exact implementation and/or the use of the device.

FIG. 11 shows a flow chart of a method of measuring loop resistance in a live earth conductor loop comprising a residual current device, according to an example. At a first block 810 the method comprises using a measurement circuit to measure a voltage across live and earth conductors of the live-earth conductor loop to determine a first voltage.

Measuring a voltage may be performed by a measurement circuit according to the examples described above. An example method of using a measurement circuit to measure a voltage across live and earth conductors is shown at blocks 812 to 816. In an example, measuring a voltage comprises filtering signals from the live-earth conductor loop with a low-pass filter characteristic, as shown at block 812. Filtering signals with a low-pass filter characteristic may attenuate the mains power supply signals and if no unipolar test current is applied between the live and earth conductors of the live-earth conductor loop then the first voltage may be zero. The measurement circuit may be electrically connected to live and earth conductors of a live-earth conductor loop. The measurement circuit may comprise an input resistor having a high resistance value to stop high currents from the live-earth conductor loop from damaging the measurement circuit. Measuring the voltage may comprise, sampling signals from the live-earth conductor loop with an analogue-to-digital converter, as shown at block 814. The ADC may have a low sampling rate relative to the mains power supply frequency for example the sampling rate of the ADC may be an eighth of the mains power supply frequency. In examples where the ADC has a sampling rate lower than the mains power supply frequency, the ADC may attenuate some of the mains power supply signals. As such signals from the live-earth conductor loop may be at least partially filtered with a low-pass filter characteristic by the sampling using the analogue-to-digital converter. Measuring the voltage between the live and earth conductors comprises determining a voltage of the sampled signals, as shown at block 816. The steps involved in measuring the voltage between the live and earth conductors may be performed in an order different to the order in which they are described above. For example, as discussed above, the ADC may sample signals from the live-earth conductor loop before the signals are filtered by the filtering system.

At block 820, the method of measuring loop resistance comprises using a current application circuit to apply a unipolar test current between the live and earth conductors of the live-earth conductor loop, wherein the unipolar test current has a magnitude below a trip current value of the residual current device. As discussed above, the current application circuit may be a passive current application circuit, in these examples applying the unipolar test current between the live and earth conductors of the live-earth conductor loop may comprise connecting at least a load resistance and a diode across the live and earth conductors of the live-earth conductor loop. Connecting the load resistance and the diode across the live and earth conductors of the live-earth conductor loop may comprise operating at least one switch, for example, the at least one switch 340.

At block 830, the method comprises, with the unipolar test current applied, using the measurement circuit to measure a voltage between the live and earth conductors to determine a second voltage. As discussed above, with a unipolar test current applied there will be a measurable voltage drop during the half cycles of the applied unipolar test current. As such, the second voltage will be indicative of the voltage drop due to the applied unipolar test current.

At block 840, the method comprises, comparing the first and second voltages to determine a change in voltage. The change in voltage being the voltage drop due to the applied unipolar test current.

At block 850, the method comprises, based on the change in current and the change in voltage between determining the first voltage and determining the second voltage, calculating the resistance of the live-earth conductor loop. As discussed above the resistance may be calculated according to equation 4 provided that the applied test current is sinusoidal such that the scaling factor of $\pi$ is used.

In an example, the method comprises using the current application circuit to apply an inverse unipolar test current between the live and earth conductors of the live-earth conductor loop, wherein the inverse unipolar test current has a magnitude below the trip current value of the residual current device and flows in the opposite direction of the unipolar test current, and wherein measuring the voltage between the live and earth conductors of the live-earth conductor loop to determine the first voltage is performed with the inverse unipolar test current applied to the live-earth conductor loop. As discussed above the inverse unipolar test current may be applied by operating at least one switch in the current application circuit. In other examples, the inverse unipolar test current may be manually applied between the live and earth conductors. With the inverse unipolar test current applied between the live and earth conductors during the measurement of the first voltage, the absolute value of the first voltage, indicative of the voltage drop during the measurement, will be non-zero. If the inverse unipolar test current is the same shape, in the example given the shape being a half cycle of sine, and magnitude as the unipolar test current then equation 5 may be used to calculate the loop resistance of the live-earth conductor loop. As discussed above for different shapes of applied test current a different scaling factor may be used. In examples, where the magnitudes of the test currents differ then the variable $2I_{peak}$ will be replaced with the difference of the two currents.

In some examples, using the measurement circuit to measure a voltage between the live and earth conductors comprises determining a plurality of voltages and calculating an average voltage based on the plurality of voltages. For example, the measurement circuit may continue to determine voltage values over several seconds, for example 3 seconds, to determine the plurality of voltages. The plurality of voltages may be averaged to determine a voltage to be used to calculate the loop resistance of the live-earth conductor loop. The averaging to the plurality of voltage signals may be performed by the controller in the device discussed above.

In some examples, at least one of the unipolar test current and the inverse unipolar test current may be a series of current pulses, wherein the amplitude of each of the series of current pulses grows and decays as a half-cycle of sine. This may be achieved using a simple current application circuit which utilises a load resistance and a diode and therefore may allow the current application circuit to be simple and reliable.

In other examples, at least one of the unipolar test current and the inverse unipolar test current may comprise a series of current pulses, wherein the amplitude of each of the series of current pulses grows and decays as a half-cycle of a square wave. As discussed above applying a test current having a profile of a square wave may be done using a current application circuit comprising a transistor to control the application of current. Using a square wave may provide better noise rejection under certain conditions because the applied test current would be independent of the amplitude of the voltage from the mains power supply for the duration of the application of current.

In some examples, the method may comprise performing the method discussed above on a powered circuit having a predetermined loop resistance, to determine a measured loop resistance. The method may comprise determining a correction factor to be applied to the measurement of loop resistance, based at least on a comparison of the measured loop resistance and the predetermined loop resistance. For example, the correction factor may be stored in memory, for example in the controller, to be used when calculating the loop resistance of a live-earth conductor loop.

Measuring the loop resistance of the live-earth conductor loop may comprise calculating a first resistance of the live-earth conductor loop and using the correction factor and the first resistance to determine a second, corrected, resistance of the live-earth conductor loop.

For the calculations of loop resistance above, an assumption that the loop resistance is negligible compared to the load resistance in the current application circuit has been made. This assumption is valid in many cases. For example, a common loop resistance of live-earth conductor loops in mains power supply systems may be around 16 Ohms whereas a resistance of the load resistor in the current application system may be as high as 16 kOhms and so the difference in resistance constitutes 0.1% which may be rectified through linear calibration for example, through the above method, or may not be compensated for.

However, in some examples where the loop resistance is not negligible when compared to the load resistance, for example, where loop resistance is as high as 2 kOhms and the resistance of the load resistor is 16 kOhms then the difference in resistance may be as high as 12.5% percent and may be non-linear. To correct for this non-linear error, the correction factor may also be a function of the loop resistance of the live-earth conductor loop. In some examples, the correction factor is a function of the magnitude of the first resistance of the live-earth conductor loop.

Figure 12:
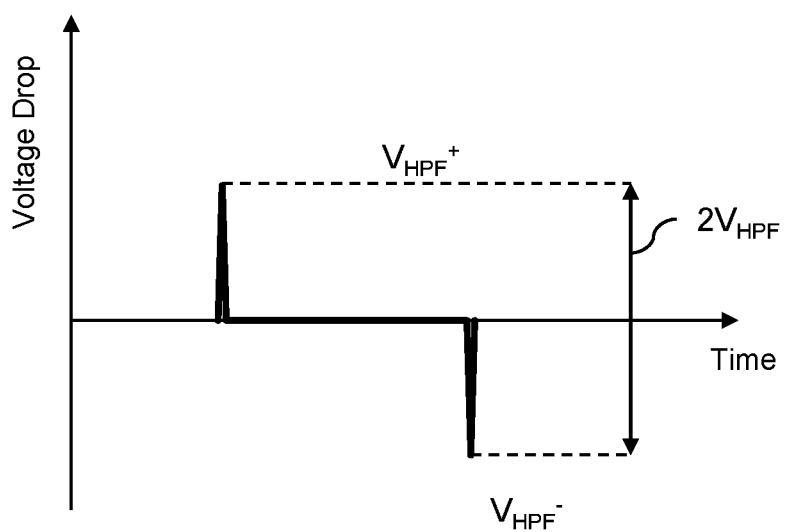
FIG. 12 shows a graph of voltage drop against time resulting from a half cycle of applied test current due to impedance according to an example.

In an example, the reactive component of impedance of a live-earth conductor loop may be determined. Returning to FIGS. 4a and 4b, the component of voltage drop due to the reactive components of impedance $V_{XL}$ rises sharply at the beginning of the test current pulse and drops sharply as the magnitude of the current pulse decreases. By using a filtering system having a high-pass filter characteristic, for example, a high pass filter typically with a monotonic response above the mains power supply frequency, the sharp edges of the induced voltage drop may be passed by the filtering system while the components due to the mains power frequency may be attenuated. By setting the cut-off frequency of the high-pass filter characteristic much higher than the frequency of the power supply to the live-earth conductor loop, the device may pass the sharp edges of the voltage drop due to the reactive components $V_{XL}$ and may attenuate the power supply voltage signal. For example, where the power supply has a frequency of 50 Hz, a high-pass filter characteristic having a cut-off frequency of 1 kHz may be used. The amplitude of the remaining voltage signals $V_{HPF}$ following the filtering will be directly proportional to the reactance present in the system, this can be seen in equation 6 below:

$$V_{HPF} = L_{loop} \frac{dI}{dt} \qquad (6)$$

where $V_{HPF}$ is the amplitude of the voltage spikes following filtering of the voltage signals using a high-pass filtering characteristic. $L_{loop}$ is the total reactance in the live-earth loop and $$\frac{dI}{dt}$$

is the rate of change of the current. FIG. 12 shows an example of the resulting voltage spikes following filtering with a high-pass filter characteristic. The amplitude of the spikes in FIG. 12 may be measured directly using a fast ADC or in some examples by using a peak-detecting electronic circuit. The peak-detecting electronic circuit may convert the peaks into a direct current signal which can be detected by a slower ADC. The detection of the amplitude of the spikes may be determined based on a detection of the amplitude of one of the spikes, both of the spike, or based on a difference between the spikes rather than absolute values of each spike.

Figure 13:
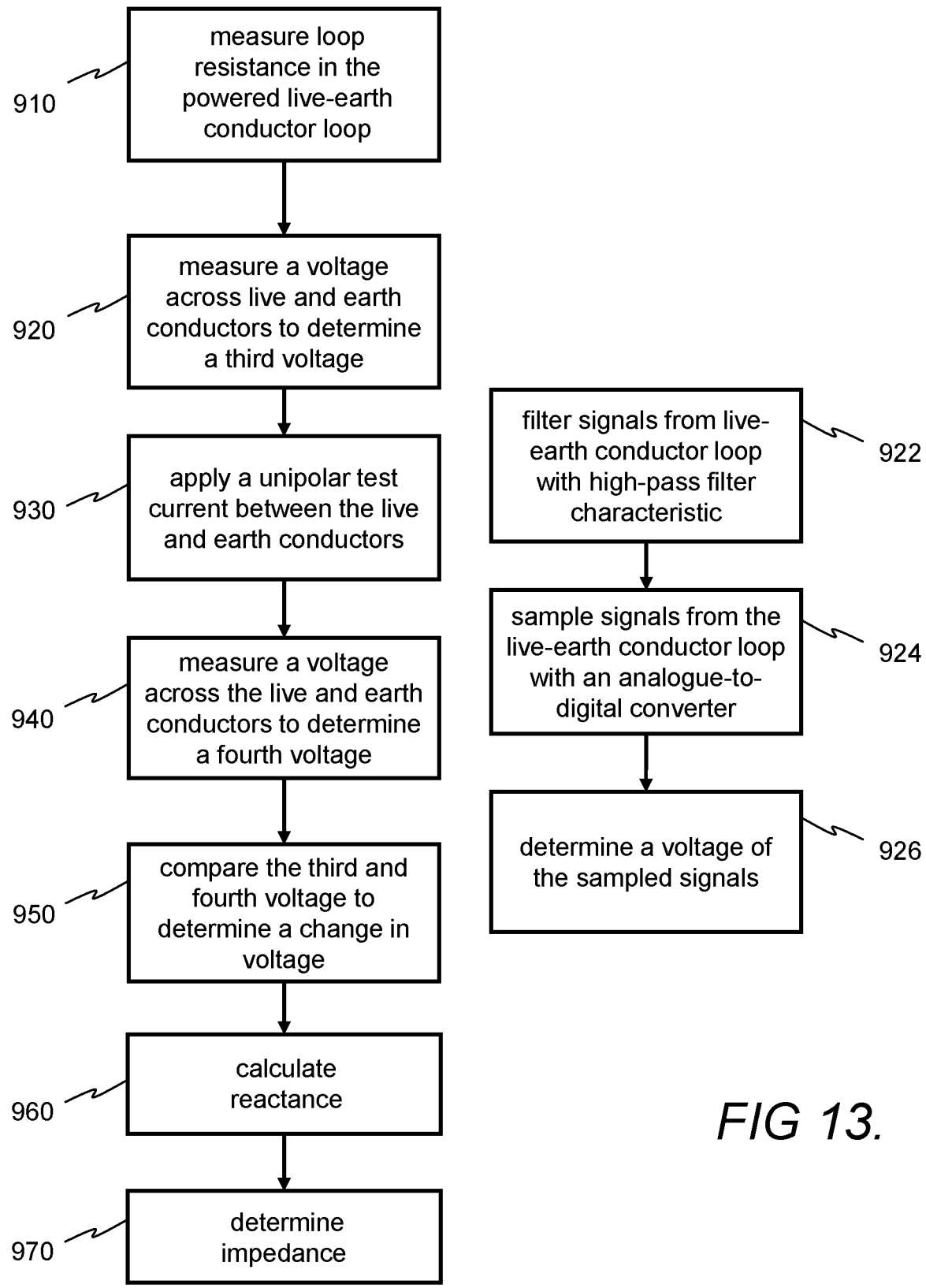
FIG. 13 shows a flow diagram of a method according to an example.

In an example, set out in FIG. 13, there is provided a method of measuring loop impedance in a powered live-earth conductor loop comprising a residual current device, the method comprising at least: measuring the loop resistance in the powered live-earth conductor loop as described herein and measuring the loop reactance of the powered live-earth conductor loop. The method comprises, at block 910, measuring the loop resistance in the powered live-earth conductor loop comprising an RCD. For example, by the method set out in FIG. 11. At block 920, the method comprises, using a measurement circuit to measure a voltage across live and earth conductors of the live-earth conductor loop to determine a third voltage.

An example method of using a measurement circuit to measure the voltage across the live and earth conductors of the live-earth conductor loop is set out in blocks 922 to 926 of FIG. 13. At block 922, measuring a voltage comprises filtering signals from the live-earth conductor loop with a high-pass filter characteristic. At block 924, measuring a voltage comprises sampling signals from the live-earth conductor loop with an analogue-to-digital converter. At block 926, measuring a voltage comprises determining a voltage of the sampled signals.

The example method comprises using a current application circuit to apply a unipolar test current between the live and earth conductors of the live-earth conductor loop, wherein the unipolar test current has a magnitude below a trip current value of the residual current device, as shown at block 930. With the unipolar test current applied, a measurement circuit is used to measure a voltage between the live and earth conductors to determine a fourth voltage, as shown at block 940. The third and fourth voltages are compared to determine a change in voltage, as shown at block 950. Based on the change in current and the change in voltage between determining the third voltage and determining the fourth voltage, calculating the reactance of the live-earth conductor loop. The loop impedance of the live-earth conductor loop is then determined, at block 970, based at least on the loop resistance measured at block 910 and the loop reactance calculated at block 960.

Although the above sets out a method of measuring loop impedance in a powered live-earth conductor loop comprising a residual current device, the method of blocks 920 to 960 may be used to determine just the loop reactance in a powered live-earth conductor loop.

Figure 14:
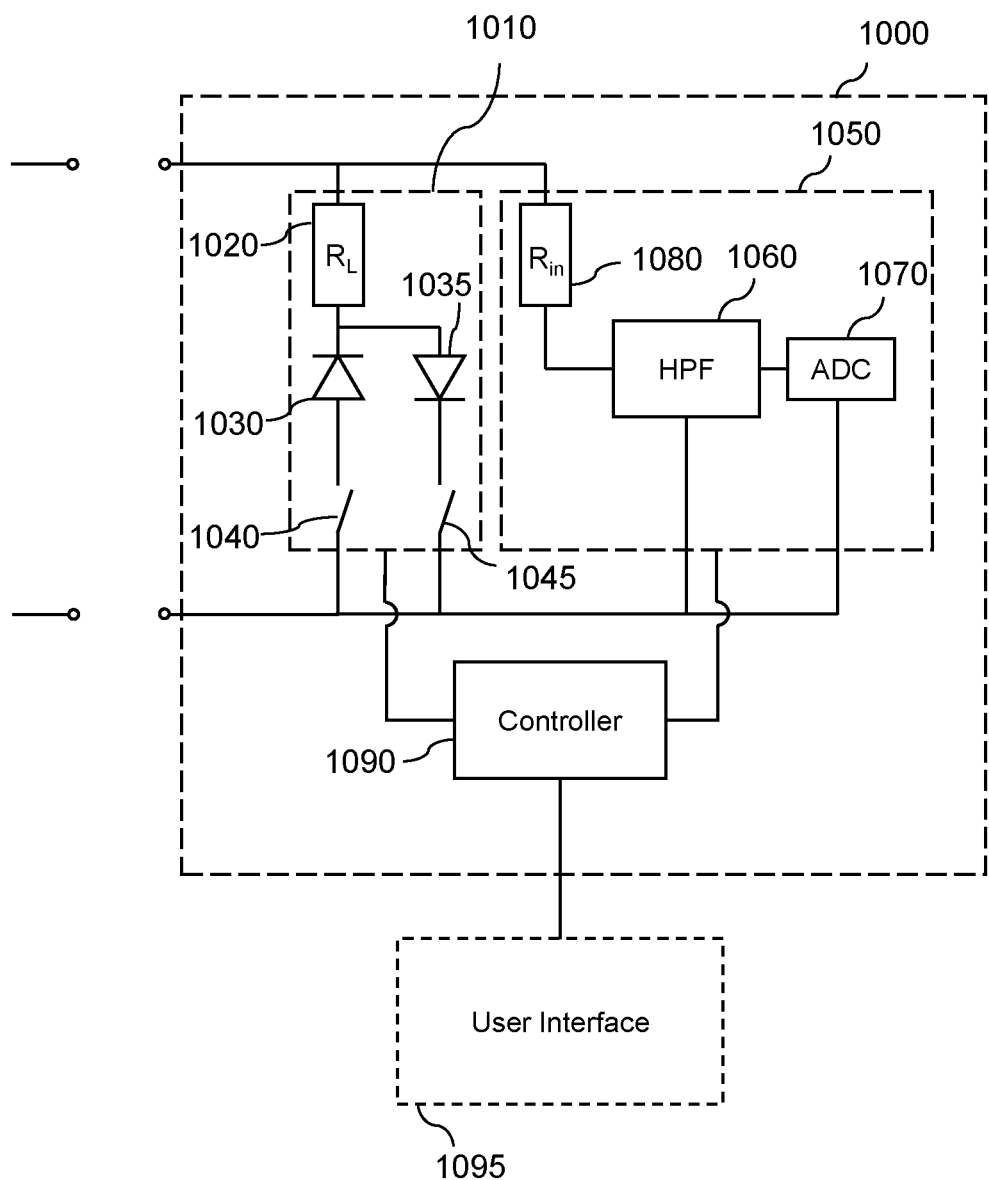
FIG. 14 shows schematically a simplified circuit diagram of a device according to a further example.

An example of a device for measuring the loop reactance in a powered live-earth conductor loop comprising a residual current device by applying unipolar test currents in opposing directions and measuring the resultant voltage drops, is shown schematically in FIG. 14. The device 1000 is very similar to the device shown in FIG. 6 for measuring the loop resistance in the live-earth conductor loop. The difference between the device of FIG. 6 and FIG. 14 lies in the measurement circuit 1050. The filtering system 1060 in FIG. 14, has a high-pass filter characteristic and therefore may allow the device to determine the reactance, as discussed above. Other components in the device of FIG. 14 share substantially the same properties as the respective components in FIG. 6 having the same last two digits, e.g. diode 430 (FIG. 6) and diode 1030 (FIG. 14) may be the same. However, the controller 1090 may be configured to operate differently when calculating reactance than when calculating resistance of a powered live-earth conductor loop.

In an example, a device for measuring the loop impedance of the powered live-earth conductor loop may comprise two measurement circuits. A first measurement circuit 450 comprising a filtering system 460 having a low-pass filter characteristic and a second measurement circuit 1050 comprising a filtering system 1060 having a high-pass filter characteristic. In some examples, the controller may be configured to switch between measuring voltage with the first measurement circuit 450, to determine resistance, and measuring voltage with second measurement circuit 1050, to determine the reactance, and thereby may use the measurements of resistance and the reactance to determine the total loop impedance in a powered live-earth conductor loop.

The above examples are to be understood as illustrative examples of the present disclosure. Further examples of the present disclosure are envisaged. It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the present disclosure, which is defined in the accompanying claims.

NUMBERED CLAUSES

The following numbered clauses describe various examples of the present disclosure:

1. A method of measuring loop resistance in a live-earth conductor loop powered by an alternating current mains supply, the live-earth conductor loop comprising a residual current device, the method comprising:
    using a measurement circuit having a low-pass filter characteristic, the low-pass filter characteristic being arranged to substantially remove signal components at the frequency of the alternating current mains supply, to measure, in a first period, a voltage across live and earth conductors of the live-earth conductor loop to determine a first voltage;
    using a current application circuit to apply a unipolar test current between the live and earth conductors of the live-earth conductor loop for a second period, wherein the unipolar test current has a magnitude below a trip current value of the residual current device;
    with the unipolar test current applied, using the measurement circuit to measure, in the second period, a voltage between the live and earth conductors to determine a second voltage;
    comparing the first and second voltages to determine a change in voltage; and
        based on a difference in test current between the first and second periods and a difference in voltage between the first voltage and the second voltage, calculating the resistance of the live-earth conductor loop.

2. The method of clause 1, comprising using the current application circuit in the first period to apply an inverse unipolar test current between the live and earth conductors of the live-earth conductor loop, wherein the inverse unipolar test current has a magnitude below the trip current value of the residual current device and flows in the opposite direction to the unipolar test current.

3. The method of clause 1, comprising applying no test current between the live and earth conductors of the live-earth conductor loop in the first period.

4. The method of any preceding clause, wherein using the measurement circuit to measure a voltage between the live and earth conductors comprises determining a plurality of voltages and calculating an average voltage based on the plurality of voltages.

5. The method of any preceding clause, wherein at least one of the unipolar test current and the inverse unipolar test current comprises a series of current pulses, and wherein the amplitude of each of the series of current pulses grows and decays as a half-cycle of sine.

6. The method of any one of clauses 1 to 4, wherein at least one of the unipolar test current and the inverse unipolar test current is a series of current pulses, and wherein the amplitude of each of the series of current pulses grows and decays as a half-cycle of a square wave 7. The method of any one of clauses 1 to 6, wherein using a current application circuit to apply a unipolar test current between the live and earth conductors of the live-earth conductor loop comprises connecting at least a load resistance and a diode across the live and earth conductors of the live-earth conductor loop.

8. The method of any preceding clause, wherein the signals from the live-earth conductor loop are at least partially filtered with a low pass characteristic by the sampling using the analogue-to-digital converter.

9. The method of any preceding clause comprising:
    performing the method according to any preceding clause on a powered circuit having a predetermined loop resistance, to determine a measured loop resistance; and
    determining a correction factor to be applied to the measured loop resistance, based at least on a comparison of the measured loop resistance and the predetermined loop resistance.

10. The method of clause 9, wherein measuring the loop resistance of the live-earth conductor loop comprises calculating a first resistance of the live-earth conductor loop and using the correction factor and the first resistance to determine a second, corrected, resistance of the live-earth conductor loop.

11. The method of clause 10, wherein the correction factor is a function of the magnitude of the first resistance of the live-earth conductor loop.

12. The method of any preceding clause comprising:
    using a further measurement circuit to measure a voltage across live and earth conductors of the live-earth conductor loop to determine a third voltage;
    using the current application circuit to apply a unipolar test current between the live and earth conductors of the live-earth conductor loop, wherein the unipolar test current has a magnitude below a trip current value of the residual current device;
    with the unipolar test current applied, using the further measurement circuit to measure a voltage between the live and earth conductors to determine a fourth voltage;
    comparing the third and fourth voltages to determine a change in voltage; and
    based on the change in current and the change in voltage between determining the third voltage and determining the fourth voltage, calculating the reactance of the live-earth conductor loop,
    wherein using a further measurement circuit to measure a voltage across live and earth conductors comprises:
        filtering signals from the live-earth conductor loop with a high-pass filter characteristic;
        sampling signals from the live-earth conductor loop with an analogue-to-digital converter; and
        determining a voltage of the sampled signals.

13. A device for measuring loop resistance in a powered live-earth conductor loop comprising a residual current device, the device for measuring loop resistance comprising:
    a current application circuit for applying a unipolar test current between live and earth conductors of the live-earth conductor loop, wherein the unipolar test current has a magnitude below a trip current value of the residual current device;
    a measurement circuit for measuring a voltage across live and earth conductors of the live-earth conductor loop, the measurement circuit comprising:
        a filtering system having a low-pass filter characteristic; and
        an analogue-to-digital converter;
    a controller for:
        controlling the application of the unipolar test current between the live and earth conductors of the live-earth conductor loop;
        causing the analogue-to-digital converter to sample signals from the live-earth conductor loop; and determining the loop resistance in the live-earth conductor loop based at least on the sampled signals and the magnitude of the unipolar test current.

14. The device of clause 13, wherein the current application circuit comprises at least a load resistance and a diode.

15. The device of clause 14, wherein the load resistance is selectable.

16. The device of clause 13, wherein the current application circuit comprises at least one transistor controllable to pass a current having a predetermined amplitude and a predetermined pulse shape between the live and earth conductors of the live-earth conductor loop.

17. The device of any one of clauses 13-16, wherein the current application circuit comprises a first current path to apply current to the live-earth conductor loop in a first direction and a second current path to apply current to the live-earth conductor loop in a second direction, and wherein the first direction and the second direction are opposing directions, the current application circuit being reconfigurable between applying a unipolar test current to the live-earth conductor loop in the first direction and the second direction.

18. The device of clause 16, wherein the controller is operable to control the current application circuit to reconfigure between applying current in the first direction and applying current in the second direction.

19. The device of any one clauses 13 to 18, wherein the filtering system is a digital filtering system.

20. The device of clause 19, wherein the digital filtering system comprises a finite impulse response filter.

21. The device of clause 19, wherein the digital filtering system comprises an infinite impulse response filter.

22. The device of any one of clauses 19 to 21, wherein the digital filtering system implements a Fourier Transform function.

23. The device of any one of clauses 13 to 22, comprising at least one voltage divider for modifying a voltage range input to the measurement circuit.

24. The device of any one of clauses 13 to 23, comprising a variable voltage divider for modifying a voltage range input to the measurement circuit.

What is claimed is:

1. A method of measuring loop resistance in a live-earth conductor loop powered by an alternating current mains supply, the live-earth conductor loop comprising a residual current device, the method comprising:
   using a measurement circuit having a low-pass filter characteristic, the low-pass filter characteristic being arranged to substantially remove signal components at the frequency of the alternating current mains supply, to measure, in a first period, a voltage across live and earth conductors of the live-earth conductor loop to determine a first voltage;
   using a current application circuit to apply a unipolar test current between the live and earth conductors of the live-earth conductor loop for a second period, wherein the unipolar test current has a magnitude below a trip current value of the residual current device;
   with the unipolar test current applied, using the measurement circuit to measure, in the second period, a voltage between the live and earth conductors to determine a second voltage;
   comparing the first and second voltages to determine a change in voltage; and
   based on a difference in test current between the first and second periods and a difference in voltage between the first voltage and the second voltage, calculating the resistance of the live-earth conductor loop.

2. The method of claim 1, comprising using the current application circuit in the first period to apply an inverse unipolar test current between the live and earth conductors of the live-earth conductor loop, wherein the inverse unipolar test current has a magnitude below the trip current value of the residual current device and flows in the opposite direction to the unipolar test current.

3. The method of claim 1, comprising applying no test current between the live and earth conductors of the live-earth conductor loop in the first period.

4. The method of claim 1, wherein using the measurement circuit to measure a voltage between the live and earth conductors comprises determining a plurality of voltages and calculating an average voltage based on the plurality of voltages.

5. The method of claim 1, wherein at least one of the unipolar test current and the inverse unipolar test current comprises a series of current pulses, and wherein the amplitude of each of the series of current pulses grows and decays as a half-cycle of sine.

6. The method of claim 1, wherein at least one of the unipolar test current and the inverse unipolar test current is a series of current pulses, and wherein the amplitude of each of the series of current pulses grows and decays as a half-cycle of a square wave.

7. The method of claim 1, wherein using a current application circuit to apply a unipolar test current between the live and earth conductors of the live-earth conductor loop comprises connecting at least a load resistance and a diode across the live and earth conductors of the live-earth conductor loop.

8. The method of claim 1, wherein the signals from the live-earth conductor loop are at least partially filtered with a low pass characteristic by the sampling using the analogue-to-digital converter.

9. The method of claim 1 comprising:
   performing the method according to any preceding claim on a powered circuit having a predetermined loop resistance, to determine a measured loop resistance; and
   determining a correction factor to be applied to the measured loop resistance, based at least on a comparison of the measured loop resistance and the predetermined loop resistance.

10. The method of claim 9, wherein measuring the loop resistance of the live-earth conductor loop comprises calculating a first resistance of the live-earth conductor loop and using the correction factor and the first resistance to determine a second, corrected, resistance of the live-earth conductor loop, and
   optionally, wherein the correction factor is a function of the magnitude of the first resistance of the live-earth conductor loop.

11. The method of claim 1 comprising:
   using a further measurement circuit to measure a voltage across live and earth conductors of the live-earth conductor loop to determine a third voltage;
   using the current application circuit to apply a unipolar test current between the live and earth conductors of the live-earth conductor loop, wherein the unipolar test current has a magnitude below a trip current value of the residual current device;

with the unipolar test current applied, using the further measurement circuit to measure a voltage between the live and earth conductors to determine a fourth voltage;
comparing the third and fourth voltages to determine a change in voltage; and
based on the change in current and the change in voltage between determining the third voltage and determining the fourth voltage, calculating the reactance of the live-earth conductor loop,
wherein using a further measurement circuit to measure a voltage across live and earth conductors comprises:
filtering signals from the live-earth conductor loop with a high-pass filter characteristic;
sampling signals from the live-earth conductor loop with an analogue-to-digital converter; and
determining a voltage of the sampled signals.

12. A device for measuring loop resistance in a powered live-earth conductor loop comprising a residual current device, the device for measuring loop resistance comprising:
a current application circuit for applying a unipolar test current between live and earth conductors of the live-earth conductor loop, wherein the unipolar test current has a magnitude below a trip current value of the residual current device;
a measurement circuit for measuring a voltage across live and earth conductors of the live-earth conductor loop, the measurement circuit comprising:
a filtering system having a low-pass filter characteristic; and
an analogue-to-digital converter;
a controller for:
controlling the application of the unipolar test current between the live and earth conductors of the live-earth conductor loop;
causing the analogue-to-digital converter to sample signals from the live-earth conductor loop; and
determining the loop resistance in the live-earth conductor loop based at least on the sampled signals and the magnitude of the unipolar test current.

13. The device of claim 12, wherein the current application circuit comprises at least a load resistance and a diode; and
optionally, wherein the load resistance is selectable.

14. The device of claim 12, wherein the current application circuit comprises at least one transistor controllable to pass a current having a predetermined amplitude and a predetermined pulse shape between the live and earth conductors of the live-earth conductor loop.

15. The device of claim 12, wherein the current application circuit comprises a first current path to apply current to the live-earth conductor loop in a first direction and a second current path to apply current to the live-earth conductor loop in a second direction, and wherein the first direction and the second direction are opposing directions, the current application circuit being reconfigurable between applying a unipolar test current to the live-earth conductor loop in the first direction and the second direction.

16. The device of claim 14, wherein the controller is operable to control the current application circuit to reconfigure between applying current in the first direction and applying current in the second direction.

17. The device of claim 12, wherein the filtering system is a digital filtering system; and
optionally, wherein the digital filtering system comprises a finite impulse response filter or an infinite impulse response filter.

18. The device of claim 17, wherein the digital filtering system implements a Fourier Transform function.

19. The device of claim 12, comprising at least one voltage divider for modifying a voltage range input to the measurement circuit.

20. The device of claim 12, comprising a variable voltage divider for modifying a voltage range input to the measurement circuit.

* * * * *